US009653172B2

(12) United States Patent
Lee

(10) Patent No.: US 9,653,172 B2
(45) Date of Patent: May 16, 2017

(54) STORAGE DEVICE AND OPERATING METHOD THEREOF

(71) Applicant: SK hynix Inc., Gyeonggi-do (KR)

(72) Inventor: Hee Youl Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/050,946

(22) Filed: Feb. 23, 2016

(65) Prior Publication Data

US 2017/0084340 A1 Mar. 23, 2017

(30) Foreign Application Priority Data

Sep. 17, 2015 (KR) .......................... 10-2015-0131689

(51) Int. Cl.
| | |
|---|---|
| *G11C 16/04* | (2006.01) |
| *G11C 16/16* | (2006.01) |
| *G11C 16/28* | (2006.01) |
| *G11C 16/10* | (2006.01) |

(52) U.S. Cl.
CPC .......... *G11C 16/16* (2013.01); *G11C 16/0483* (2013.01); *G11C 16/10* (2013.01); *G11C 16/28* (2013.01)

(58) Field of Classification Search
CPC ..... G11C 16/08; G11C 16/10; G11C 16/0483; G11C 16/26; G11C 11/30; G11C 2216/16
USPC ........................................ 365/185.11, 185.18
See application file for complete search history.

(56) References Cited

U.S. PATENT DOCUMENTS

2014/0136765 A1* 5/2014 Oh .................... G11C 16/0483
711/103

FOREIGN PATENT DOCUMENTS

| KR | 1020090117713 | 11/2009 |
|---|---|---|
| KR | 1020150014680 | 2/2015 |

* cited by examiner

*Primary Examiner* — Huan Hoang
(74) *Attorney, Agent, or Firm* — IP & T Group LLP

(57) ABSTRACT

There are provided a storage device and an operating method thereof. A storage device includes a main block including a plurality of sub-blocks, a peripheral circuit for generating operation voltages used in a read operation of a selected sub-block among the sub-blocks and performing the read operation of the selected sub-block by using the operation voltages, and a control logic for, when an erased sub-block among the sub-blocks is included in the read operation, controlling the peripheral circuit to perform the read operation by lowering levels of some of the operation voltages.

14 Claims, 24 Drawing Sheets

STORAGE DEVICE AND OPERATING METHOD THEREOF

CROSS-REFERENCE TO RELATED APPLICATION

The present application claims priority to Korean patent Application No. 10-2015-0131689, filed on Sep. 17, 2015, the entire disclosure of which is herein incorporated by reference in its entirety.

BACKGROUND

1. Field of Invention

Various embodiment of the present disclosure relate generally to semiconductor technology and more particularly to a three-dimension-structured storage device and an operating method thereof.

2. Description of the Related Art

A memory system, may include a memory device for storing data and a memory controller for generally controlling the memory device, A memory device includes a plurality of storage devices, and each of the storage devices may include a memory cell array of a three-dimensional structure.

A three-dimension-structured storage device may include a memory cell array for storing data, a peripheral circuit for performing a program, erase, and read operations on the memory cell array, and a control logic for controlling the peripheral circuit.

The memory cell array may include a plurality of memory blocks. Each of the memory blocks may include a plurality of strings formed into a three-dimensional structure. Each of the strings having the three-dimensional structure may include a plurality of memory cells stacked in a direction perpendicular to a substrate.

SUMMARY

Various embodiments of the present disclosure are directed to a storage device and an operating method thereof, in which levels of voltages used in a read operation of a three-dimension-structured storage device are adjusted, thereby improving the reliability of the read operation.

According to an aspect of the present disclosure, there is provided a storage device including: a main block configured to include a plurality of sub-blocks; a peripheral circuit configured to generate operation voltages used in a read operation of a selected sub-block among the sub-blocks, and perform the read operation of the selected sub-block by using the operation voltages; and a control logic configured to, when an erased sub-block among the sub-blocks is included in the read operation, control the peripheral circuit to perform the read operation by lowering levels of some of the operation voltages.

According to an aspect of the present disclosure, there is provided a method of operating a storage device, the method including: deciding whether any sub-block in an erase state exists in a selected main block; and if the sub-block in the erase state does not exist, performing a read operation of the main block by using first operation voltages, and if the sub-block in the erase state exists, performing the read operation of the main block by using second operation voltages having lower levels than the first operation voltages or by using some of the first operation voltages and some of the second operation voltages.

According to an aspect of the present disclosure, there is provided a method of operating a storage device, the method including: deciding whether any sub-block in an erase state exists in a selected main block; if the sub-block in the erase state does not exist, generating first operation voltages according to a first read parameter, and if the sub-block in the erase state exists, generating second operation voltages according to a second read parameter; and performing a read operation of the selected main block by using the first operation voltages or the second operation voltages.

DETAILED DESCRIPTION

Figure 1:
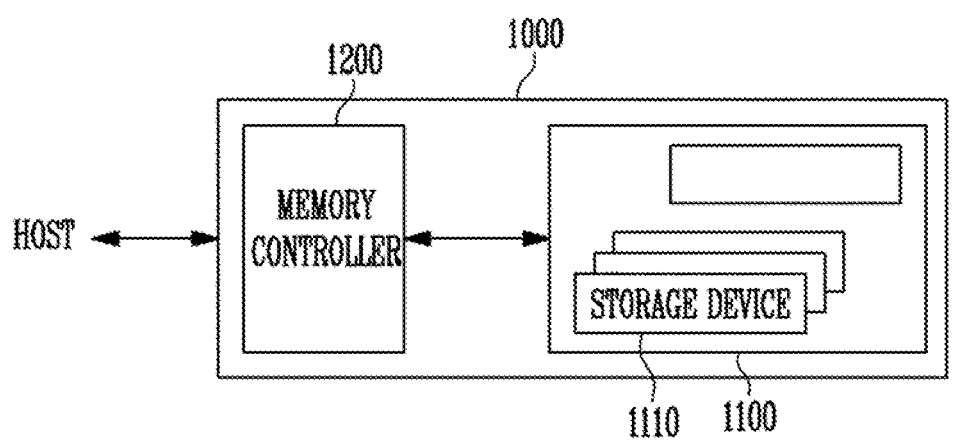
FIG. 1 is a diagram illustrating a memory system, according to an embodiment of the present disclosure.

Example embodiments of the invention will now be described more fully hereinafter with reference to the accompanying drawings. It is noted, however, that the invention may be embodied in different forms and should not be construed as limited to the embodiments set forth herein. Rather, these embodiments are provided so that this disclosure will be thorough and complete and will fully convey the various features and aspects of the invention to those skilled in the art.

In the drawings the various features are not drawn necessarily to scale and some dimensions may be exaggerated for clarity of illustration. Also, it will be understood that when an element is referred to as being "between" two elements, it can be the only element between the two elements, or one or more intervening elements may also be present. Like reference numerals refer to like elements throughout.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

FIG. 1 is a diagram illustrating a memory system 1000 according to the present disclosure.

Referring to FIG. 1, the memory system 1000 may include a memory device 1100 for storing data and a memory controller 1200 for controlling the memory device 1100.

The memory device 1100 may include a plurality of storage devices 1110s. The storage devices 1110s may be or include a nonvolatile memory. The storage device may be or include a double data rate synchronous dynamic random access memory (DDR SDRAM), a low power double data rate 4 (LPDDR4) SDRAM, a graphics double data rate (GDDR) SRAM, a low power DDR (LPDDR), a rambus dynamic random access memory (RDRAM), a flash memory, or the like. In the following embodiment described herein, the storage device 1110 is configured as a NAND flash memory as an example. Also, the storage device 1110 may include a plurality of memory blocks in which strings having a three-dimensional structure are included.

The memory controller 1200 may control the overall operations of the memory device 1100. For example, the memory controller 1200 may output, to the memory device 1100, commands, addresses, and data for controlling the memory device 1100 or receive data from the memory device 1100 in response to a command received from a host.

The memory system 1000 may communicate with the host by using an interface protocol such as peripheral component interconnect-express (PCI-E), advanced technology attachment (ATA), serial ATA (SATA), parallel ATA (PATA), serial attached SCSI (SAS) protocols, or the like.

Figure 2:
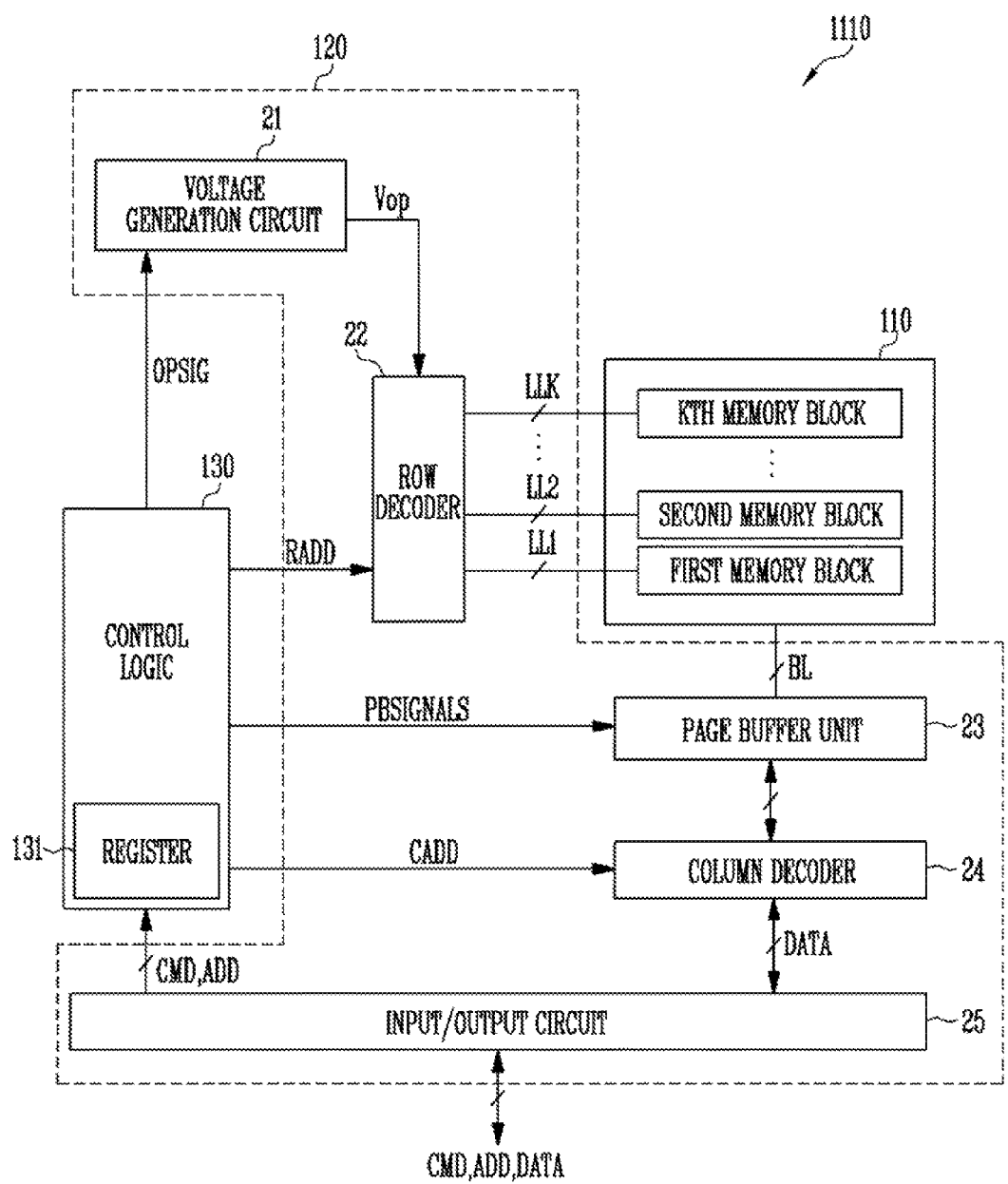
FIG. 2 is a more detailed diagram of an example of a storage device shown in FIG. 1.

Referring to FIG. 2, a storage device 1110 according to an embodiment of the invention may include a memory cell array 110 for storing data, a peripheral circuit 120 for performing a program, read, and erase operations on the memory cell array 110, and a control logic 130 for controlling the peripheral circuit 120.

The memory cell array 110 may include first to Kth memory blocks (K is a positive integer) configured identically to one another. The first to Kth memory blocks may be formed into a three-dimensional structure. The first to Kth memory blocks may be coupled to first to Kth local lines LL1 to LLK, respectively. Also, each of the first to Kth memory blocks may include a plurality of sub-blocks. The first to Kth memory blocks may include normal cells for storing normal data, and spare cells (or flag cells) for storing data required to operate the storage device 1110. The spare cells (or flag cells) may store information on erased sub-blocks.

The peripheral circuit 120 may include a voltage generation circuit 21, a row decoder 22, a page buffer unit 23, a column decoder 24, and an input/output circuit 25.

The voltage generation circuit 21 may generate operation voltages Vop having various levels in response to operation data OPSIG, and selectively apply the generated operation voltages Vop to global lines. For example, the operation data OPSIG may include an operation signal and word line information (or word line group information). If a read operation data OPSIG is received, the voltage generation circuit 21 may generate operation voltages Vop including a pipe voltage, a pass voltage, a turn-on voltage, a dummy pass voltage, a read voltage, and the like, which are required to perform a read operation. For example, a pipe voltage may be generated when memory blocks are formed into a U-shaped structure including a pipe transistor. A pipe voltage may not be generated when the memory blocks are formed into an I-shaped structure including no pipe transistor. The structure of memory blocks having a U-shaped or I-shaped structure will be described in detail later.

The row decoder 22 may transmit operation voltages Vop to local lines coupled to a selected memory block among the first to Kth local lines LL1 to LLK in response to a row address RADD. For example, the row decoder 22 may be coupled to the voltage generation circuit 21 through the global lines. In this state, the row decoder 22 may transmit the operation voltages Vop transmitted through the global lines to the local lines coupled to the selected memory block.

The page buffer unit 23 may be coupled to the memory cell array 110 through bit lines BL. The page buffer unit 23 may precharge the bit lines BL to a positive voltage in response to a page buffer control signal PBSIGNALS, transmit/receive data to/from a selected memory block in program and read operations, or temporarily store the received data.

The column decoder 24 may transmit/receive data DATA to/from the page buffer unit 23 or transmit/receive data DATA to/from the input/output circuit 25 in response to a column address CADD.

The input/output circuit 25 may transmit, to the control logic 130, a command CMD and an address ADD, received from an external device (e.g., a memory controller), transmit data DATA received from the external device to the column decoder 24, or output data DATA received from the column decoder to the external device.

The control logic 130 may control the peripheral circuit 120 in response to a command CMD and an address ADD. If any erased sub-block is not included in a selected memory block in a read operation of the selected memory block, the control logic 130 may output operation data OPSIG so that voltages required to perform the read operation may be generated based on predetermined voltage conditions. If at least one erased sub-block is included in the selected memory block, the control logic 130 may output the operation data OPSIG so that the voltages required to perform the read operation may be variably generated by controlling some of the predetermined voltage conditions. For example, if at least one erased sub-block is included in the selected memory block, the control logic 130 may output the operation data OPSIG so that the level of at least one of a pipe voltage, a pass voltage, a turn-on voltage, a dummy pass voltage, and a read voltage may be higher than a reference level. The control logic 130 may include a register 131 for storing information on erased sub-blocks.

Figure 3:
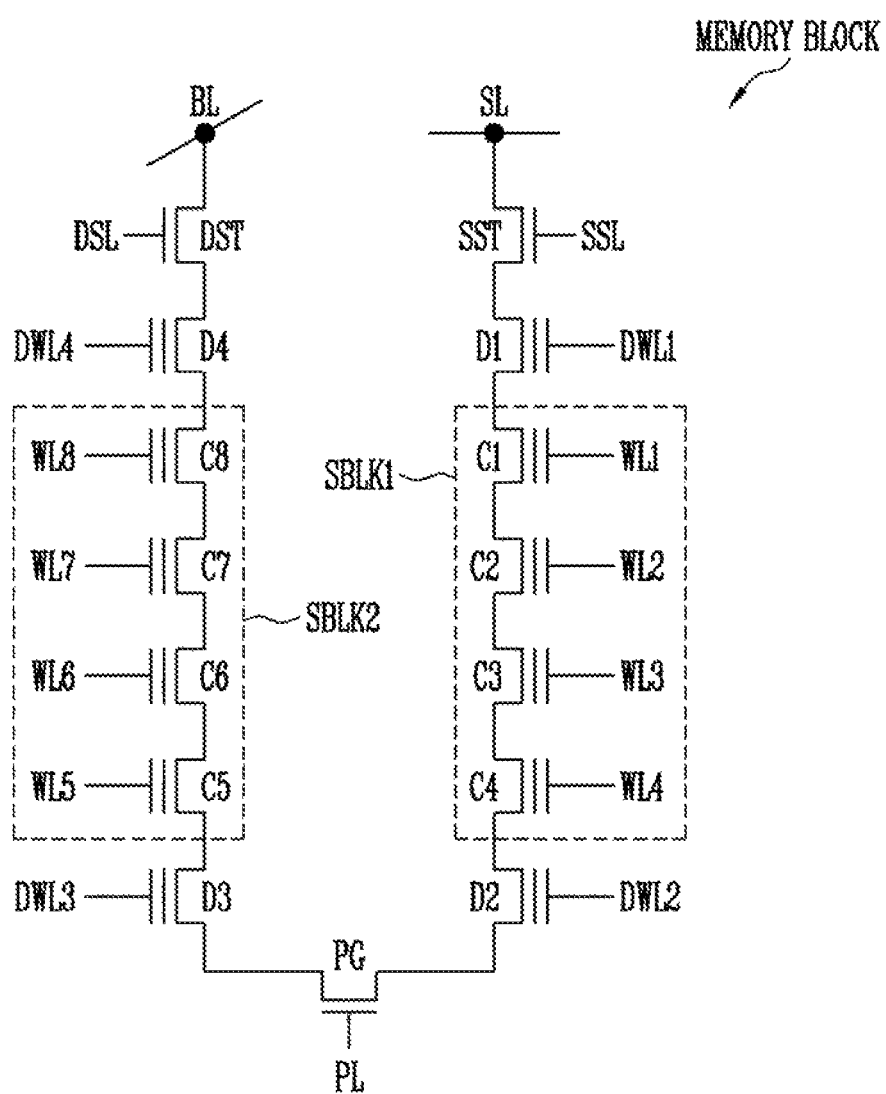
FIG. 3 is a circuit diagram of an example of a memory block shown in FIG. 2.

FIG. 3 is a circuit diagram of a memory block shown in FIG. 2. Referring to FIG. 3, the memory block may have a three-dimensional structure including strings having a U-shaped structure. This structure may be referred to as a pipe-shaped bit cost scalable (P-BiCS) structure. The P-BiCS structure includes a pipe transistor PG for coupling a first vertical string coupled to a source line SL and a second vertical string coupled to a bit line BL to each other.

Among the strings included in the memory block, any one string will be described in detail as follows.

The memory block may include a first vertical string coupled between the source line SL and the pipe transistor PG, and a second vertical string coupled between the bit line BL and the pipe transistor PG. The first and second vertical strings are arranged in the vertical direction on a substrate (i.e., in a direction perpendicular to a substrate).

The first vertical string may include a source select transistor SST, a first dummy cell D1, first to fourth memory cells C1 to C4, and a second dummy cell D2, which may be coupled in series to each other. The source select transistor SST may be coupled between the source line SL and the first dummy cell D1, and the second dummy cell D2 may be coupled between the fourth memory cell C4 and the pipe transistor PG.

The second vertical string may include a third dummy cell D3, fifth to eighth memory cells C5 to C8, a fourth dummy cell D4, and a drain select transistor DST, which may be coupled in series to each other. The third dummy cell D3 may be coupled between the pipe transistor PG and the fifth memory cell C5, and the drain select transistor DST may be coupled between the fourth dummy cell D4 and the bit line BL. It is noted that the number of the source select transistor SST, the first to fourth dummy cells D1 to D4, and the first to eighth memory cells C1 to C8 may be increased. A gate of the source select transistor SST may be coupled to a source select line SSL. Gates of the first to fourth dummy cells D1 to D4 may be coupled to first to fourth dummy lines DWL1 to DWL4, respectively. Gates of the first to eighth memory cells C1 to C8 may be coupled to first to eighth word lines WL1 to WL8, respectively. A gate of the pipe transistor PG may be coupled to a pipe line PL.

The memory block may include a plurality of sub-blocks. The first to fourth memory cells C1 to C4 included in the first vertical string may be defined as a first sub-block, and the fifth to eighth memory cells C5 to C8 included in the second vertical string may be defined as a second sub-block. Having the memory divided into sub-blocks allows operations to be selectively performed on a sub-block basis. For example, in an erase operation for a memory block, the first and/or the second sub-blocks may be selectively erased. For example, a first sub-block may be erased while the second sub-block may maintain a program state. Also, for example, a read operation for the memory block may be performed on a sub-block in a program state.

Figure 4:
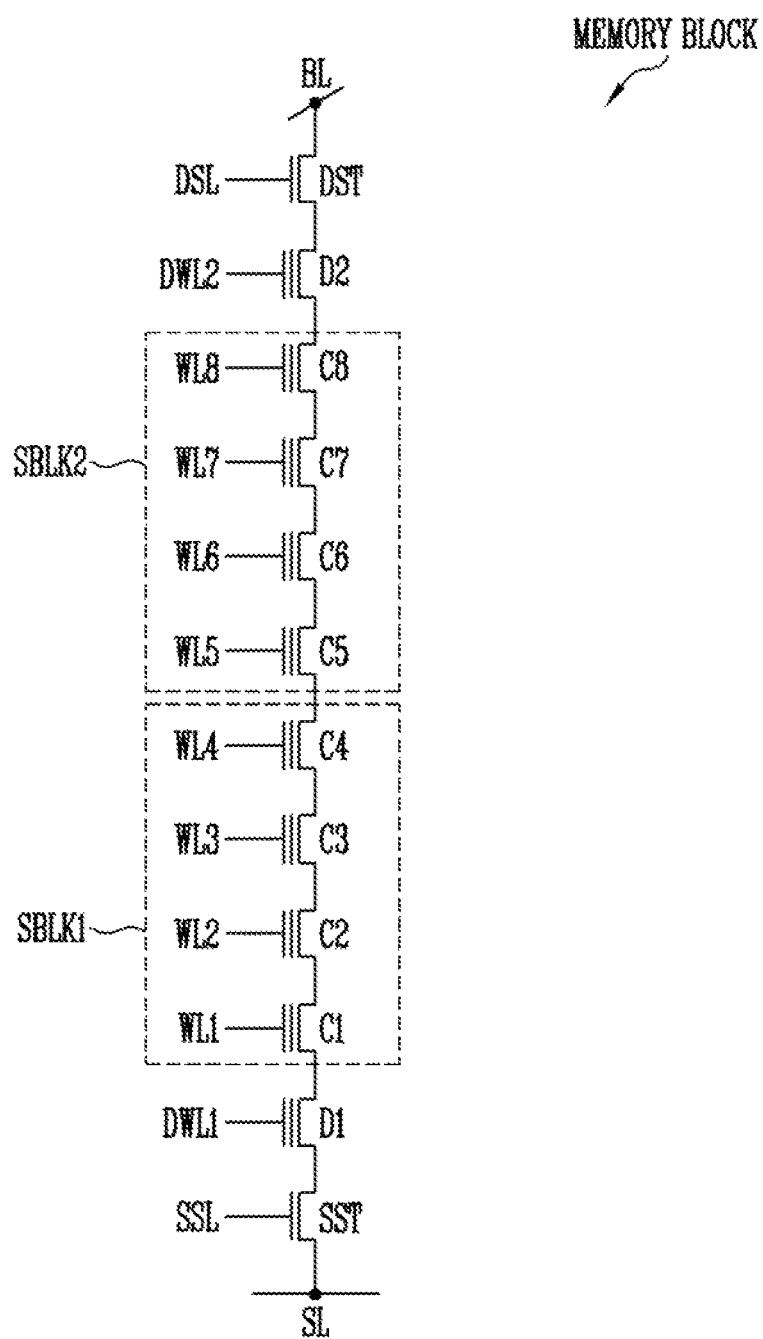
FIG. 4 is a circuit diagram of another example of a memory block shown in FIG. 2.

Referring to FIG. 4, a memory block having a three-dimensional structure may include strings having an I-shaped structure. This structure may be referred to as a bit cost scalable (BiCS) structure. In the BiCS structure, a vertical string may be coupled between a source line SL and a bit line BL, and disposed in the vertical direction on a substrate, e.g., in a direction perpendicular to a substrate.

Among the strings included in the memory block, any one string will be described in detail as follows.

The vertical string may include a source select transistor SST, a first dummy cell D1, first to eighth memory cells C1 to C8, a second dummy cell D2, and a drain select transistor DST, which may be coupled in series to each other. The source select transistor SST may be coupled between the source line SL and the first dummy cell D1, and the drain select transistor DST may be coupled between the second dummy cell D2 and the bit line BL. It The number of the source select transistor SST, the first and second dummy cells D1 and D2, the first to eighth memory cells C1 to C8, and the drain select transistor DST may be increased according to storage devices.

The memory block may include a plurality of sub-blocks. For example, a group of the first to fourth memory cells C1 to C4 may be defined as a first sub-block, and a group of the fifth to eighth memory cells C5 to C8 may be defined as a second sub-block. In an erase operation for the memory block, the first and second sub-blocks may be selectively erased. When any one of the first and second sub-blocks is erased, the other sub-block maintains a program state. A read operation for the memory block is performed on a sub-block in the program state.

Figure 5:
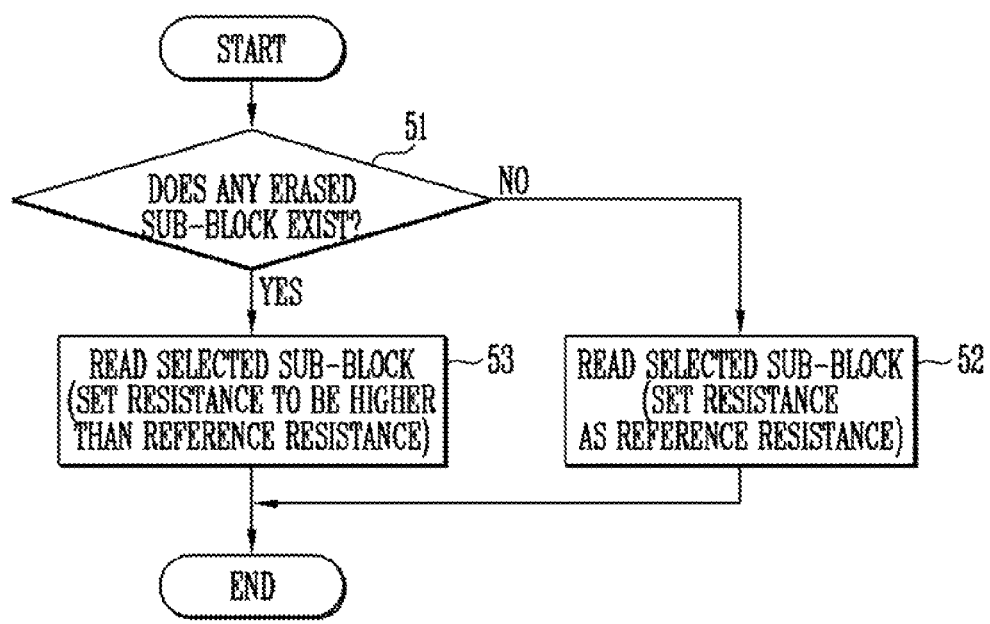
FIG. 5 is a flowchart describing a read operation, according to an embodiment of the present disclosure.

FIG. 5 is a flowchart for describing a read operation according to the present disclosure.

Referring to FIG. 5, the read operation may be differently performed according to whether any sub-block in an erase state is included in a selected memory block. For example, if a read operation for a selected memory block is started, it is decided whether any erased sub-block is included in the selected memory block (51). The method for deciding whether any erased sub-block is included in the selected memory block is diverse. For example, when information on an erased sub-block is stored in spare cells (or flag cells) included in a selected memory block, the control logic may decide whether the erased sub-block is included in the selected memory block according to the information stored in the spare cells (or flag cells). Alternatively, when information on an erased sub-block is stored in a register (e.g., the register 131 of the control logic 130 shown in FIG. 2), the control logic may decide whether the erased sub-block is included in the selected memory block according to the information stored in the register. Alternatively, the control logic may decide whether erased memory cells are included in the selected memory block by performing an erase verify operation or read operation on normal memory cells included in the selected memory block. For example, when the erase verify operation is performed, the control logic may decide whether erased memory cells are included in the selected memory block by simultaneously erasing and verifying memory cells included in the selected memory block. When the read operation is performed, the control logic may decide whether erased memory cells are included in the selected memory block by reading pages included in the selected memory block in units of pages.

If any erased sub-block does not exist (No), the read operation on a selected sub-block included in the selected memory block is performed by using voltages set according to a reference resistance of the vertical string (52). For example, if there is no erased sub-block, the control logic may control the peripheral circuit to generate operation voltages according to a first read parameter.

If any erased sub-block exists (Yes), the read operation on the selected sub-block included in the selected memory block is performed by using voltages set according to a resistance higher than the reference resistance of the vertical string (53). Here, the voltages set according to the resistance higher than the reference resistance refer to voltages having levels lower than a reference level, and may be set through a test operation. For example, if any erased sub-block exists, the control logic may control the peripheral circuit to generate operation voltages according to a second read parameter. Specifically, the operation voltages may be generated according to the second read parameter set so that the level of at least one of a bit line voltage, a source line voltage, a pipe voltage, a pass voltage, a turn-on voltage, a dummy pass voltage, and a read voltage is lower than the reference level. As the number of erased sub-blocks increases, channel resistance may decrease. Therefore, various read parameters may be stored according to the number of erased sub-blocks. These read parameters may be stored in the register of the control logic.

The reason why the levels of operation voltages are lowered is that, if any erased sub-block exists in the selected memory block, the channel resistance of the erased sub-block is lowered. Hence, it is required to increase the entire channel resistance of the memory block. To this end, if the level of at least one of the bit line voltage, the pipe voltage, the pass voltage, the turn-on voltage, the dummy pass voltage, and the read voltage is lowered than the reference level, the channel resistance of the string is increased by the lowered level. That is, the amount of current is decreased by lowering the levels of the above-described voltages, so that it is possible to compensate for lowering of electrical characteristics of the read operation due to the erased sub-block. Here, the levels of the above-described voltages are lowered so as to decrease the amount of current. However, a positive voltage higher than 0V may be applied to the source line grounded in the read operation.

FIGS. 6 to 16 are diagrams for describing various embodiments of the read operation on the memory block having the P-BiCS structure.

Figure 6:
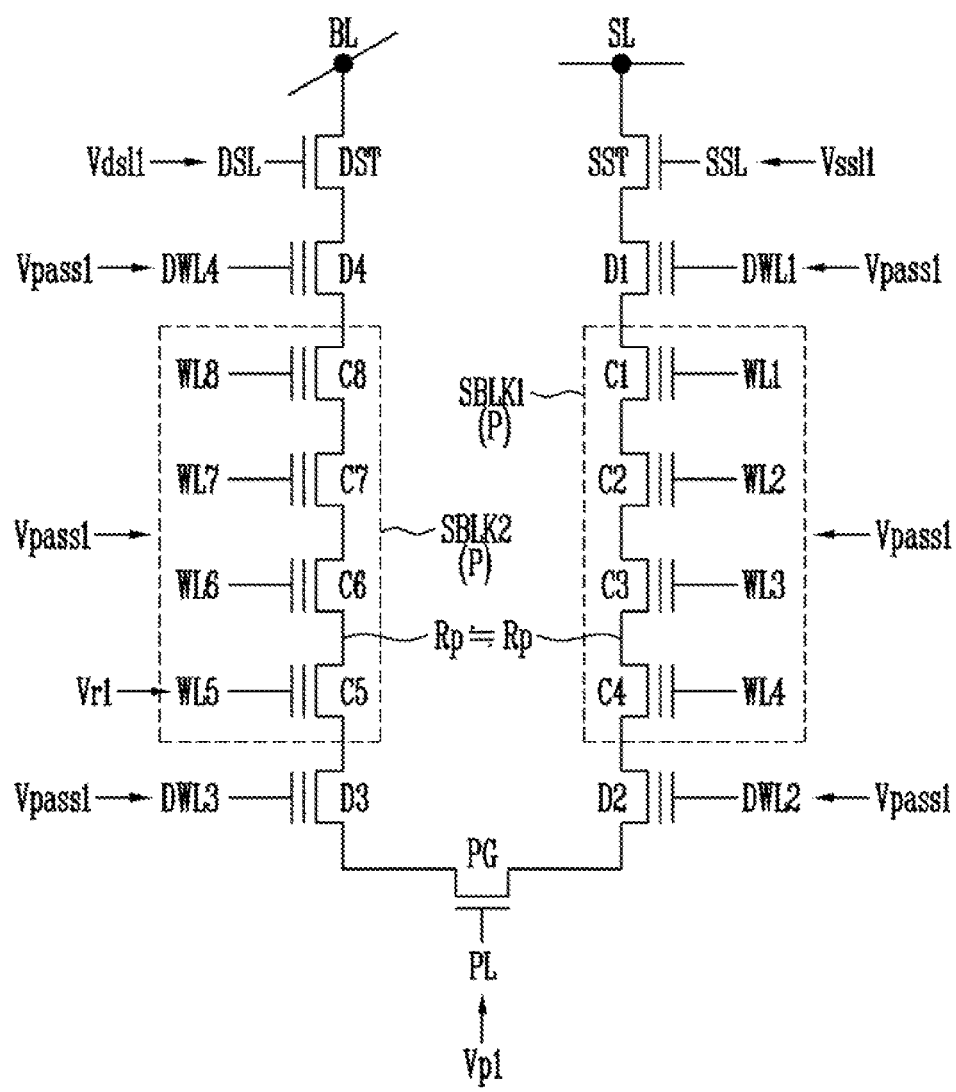
FIGS. 6 to 16 are diagrams illustrating various embodiments of a read operation on a memory block having a pipe-shaped bit cost scalable (P-BiCS) structure, according to an embodiment of the present disclosure.

Referring to FIG. 6, when both first and second sub-blocks SBLK1 and SBLK2 included in a selected memory block are programmed sub-blocks P, voltages set in consideration of predetermined voltages, i.e., a reference resistance may be used. The read operation for a fifth memory cell C5 included in the second sub-block SBLK2 out of the first and second sub-blocks SBLK1 and SBLK2 will be described as an example.

In the read operation for the second sub-block SBLK2, a first pipe voltage Vp1 may be applied to the pipe line PL, and a first pass voltage Vpass1 may be applied to the first to fourth word lines WL1 to WL4, the sixth to eighth word lines WL6 to WL8, and the first to fourth dummy lines DWL1 to DWL4. A first source turn-on voltage Vssl1 may be applied to the source select line SSL, and a first drain turn-on voltage Vdsl1 may be applied to the drain select line DSL. A first read voltage Vr1 may be applied to the fifth word line WL5.

The first pipe voltage Vp1, the first pass voltage Vpass1, the first source turn-on voltage Vssl1, the first drain turn-on voltage Vdsl1, and the first read voltage Vr1 are predetermined voltages, and may be generated when any erased sub-block does not exist among the sub-blocks included in the selected memory block. Alternatively, the first pipe voltage Vp1, the first pass voltage Vpass1, the first source turn-on voltage Vssl1, the first drain turn-on voltage Vdsl1, and the first read voltage Vr1 may be generated when the channel resistance Rp of the first sub-block SBLK1 and the channel resistance Rp of the second sub-block SBLK2 are equal or similar to each other (Rp≈Rp).

Figure 7:
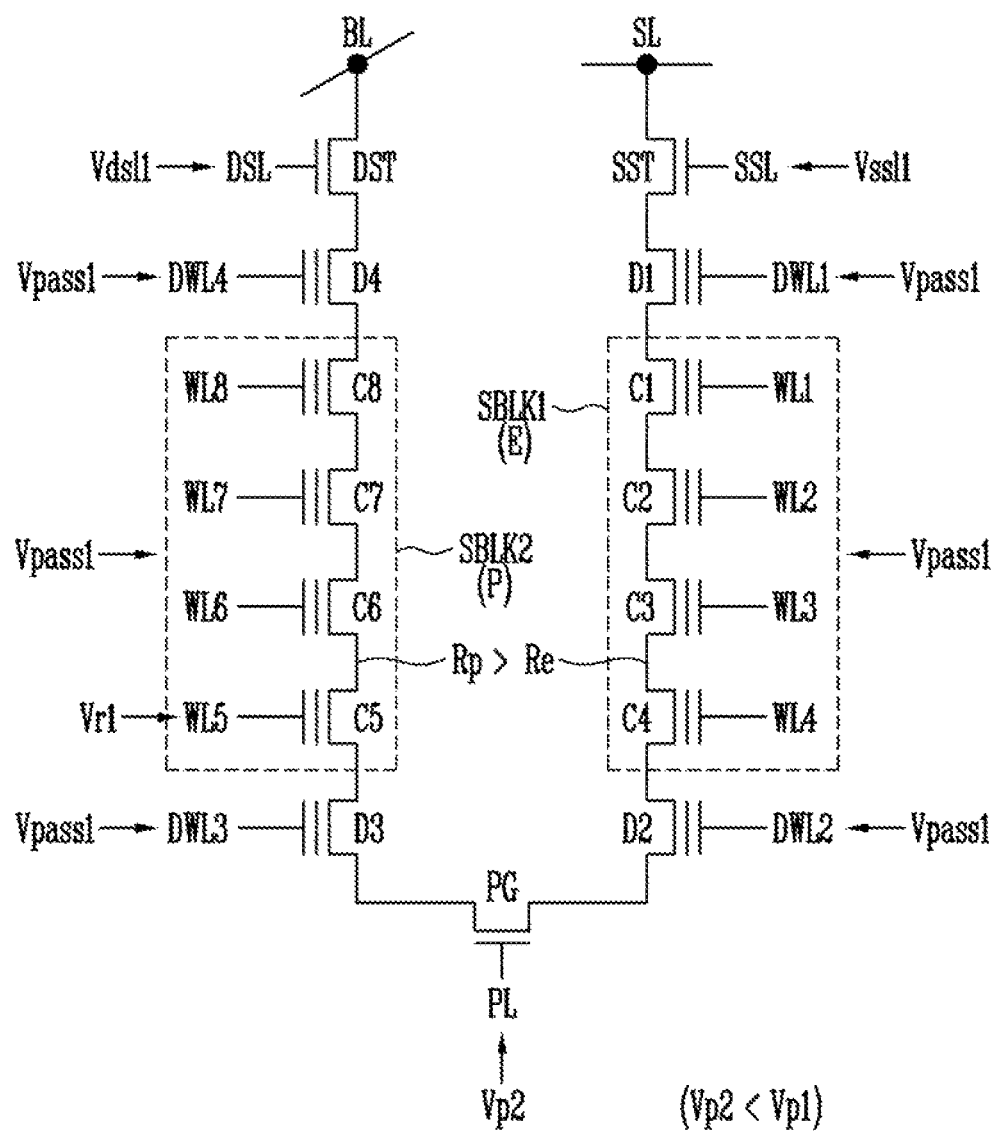

Referring to FIG. 7, when the first sub-block SBLK1 out of the first and second sub-blocks SBLK1 and SBL2 included in the selected memory block is an erased sub-block E, and the second sub-block SBLK2 out of the first and second sub-blocks SBLK1 and SBL2 included in the selected memory block is a programmed sub-block P, the channel resistance Re of the erased first sub-block SBLK1 may be lowered than the channel resistance Rp of the second sub-block SBLK2. In this case, in the read operation for the selected second sub-block SBLK2, a second pipe voltage Vp2 lower than the first pipe voltage Vp1 may be applied to the pipe line PL so as to increase the channel resistance. The read operation for the fifth memory cell C5 included in the second sub-block SBLK2 out of the first and second sub-blocks SBLK1 and SBLK2 will be described as an example.

In the read operation for the fifth memory cell C5 included in the second sub-block SBLK2, the second pipe voltage Vp2 having a lower level than the first pipe voltage Vp1 may be applied to the pipe line PL, and the first pass voltage Vpass1 may be applied to the first to fourth word lines WL1 to WL4, the sixth to eighth word lines WL6 to WL8, and the first to fourth dummy lines DWL1 to DWL4. The first source turn-on voltage Vssl1 may be applied to the source select line SSL, and the first drain turn-on voltage Vdsl1 may be applied to the drain select line DSL. The first read voltage Vr1 may be applied to the fifth word line WL5.

If the second pipe voltage Vp2 having a lower level than the first pipe voltage Vp1 is applied to the pipe line PL, the channel resistance of the pipe transistor PG is increased as coupling between the channel and the pipe line PL is decreased as compared with when the first pipe voltage Vp1 is applied. Thus, the read operation on the fifth memory cell C5 included in the second sub-block SBLK2 may be performed by compensating for a decrease in channel resistance due to the erased first sub-block SBLK1.

Figure 8:
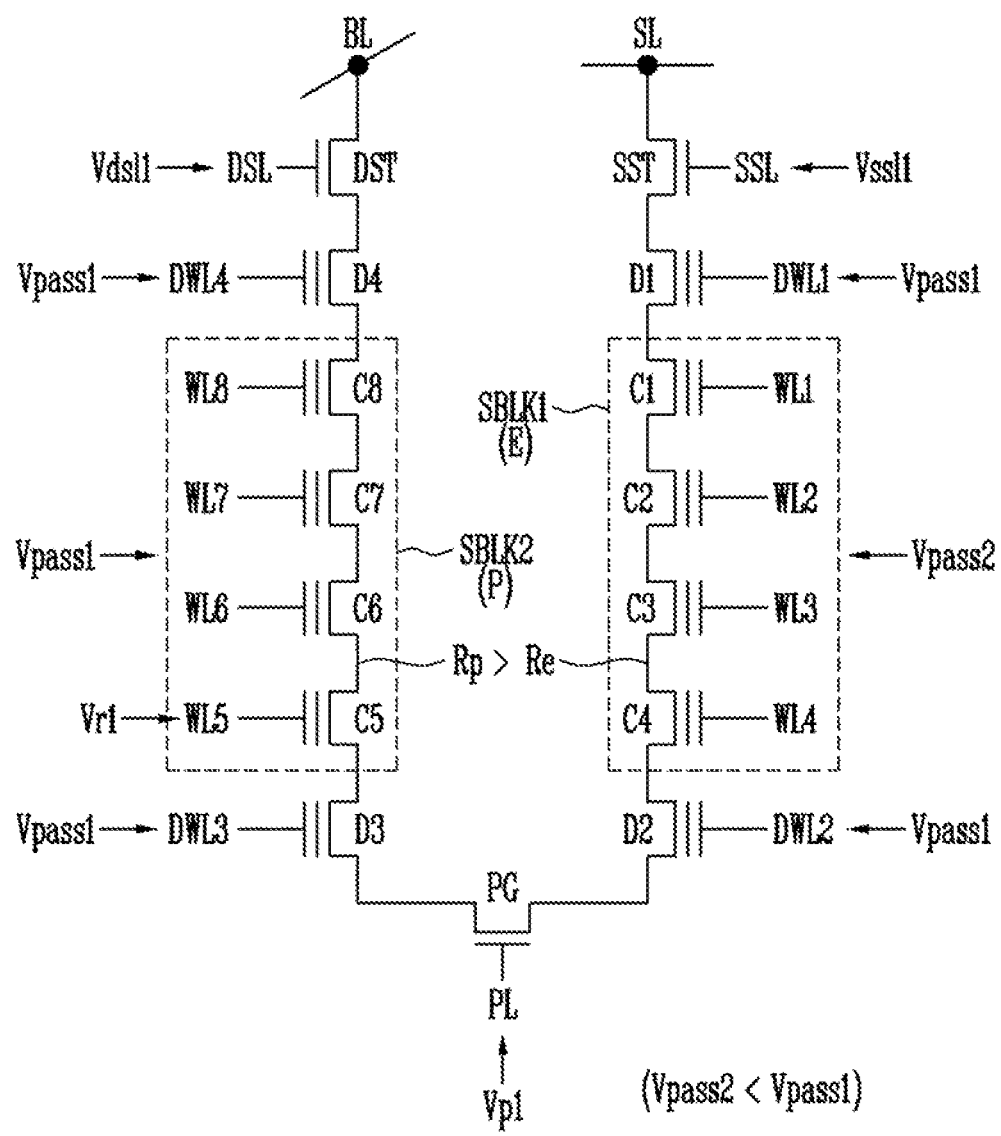

Referring to FIG. 8, when the first sub-block SBLK1 out of the first and second sub-blocks SBLK1 and SBL2 included in the selected memory block is an erased sub-block E, and the second sub-block SBLK2 out of the first and second sub-blocks SBLK1 and SBL2 included in the selected memory block is a programmed sub-block P, the channel resistance Re of the erased first sub-block SBLK1 may be lowered than the channel resistance Rp of the second sub-block SBLK2. In this case, in the read operation on the selected second sub-block SBLK2, a second pass voltage Vpass2 lower than the first pass voltage Vpass1 may be applied to the first to fourth word lines WL1 to WL4 coupled to the erased first sub-block SBLK1 so as to increase the channel resistance. The read operation for the fifth memory cell C5 included in the second sub-block SBLK2 out of the first and second sub-blocks SBLK1 and SBLK2 will be described as an example.

In the read operation for the fifth memory cell C5 included in the second sub-block SBLK2, the second pass voltage Vpass2 having a lower level than the first pass voltage Vpass1 may be applied to the first to fourth word lines WL1 to WL4 coupled to the first sub-block SBLK1, and the first pipe voltage Vp1 may be applied to the pipe line PL. The first pass voltage Vpass1 may be applied to the sixth to eighth word lines WL6 to WL8 and the first to fourth dummy lines DWL1 to DWL4, and the first source turn-on voltage Vssl1 may be applied to the source select line SSL. The first drain turn-on voltage Vdsl1 may be applied to the drain select line DSL, and the first read voltage Vr1 may be applied to the fifth word line WL5.

If the second pass voltage Vpass2 having a lower level than the first pass voltage Vpass1 is applied to the first to fourth word lines WL1 to WL4 coupled to the erased first sub-block SBLK1, the channel resistance Re of the first sub-block SBLK1 is increased as coupling between the channel and the first to fourth word lines WL1 to WL4 is decreased as compared with when the first pass voltage Vpass1 is applied. Thus, the read operation on the fifth memory cell C5 included in the second sub-block SBLK2 may be performed by compensating for a decrease in channel resistance due to the erased first sub-block SBLK1.

Figure 9:
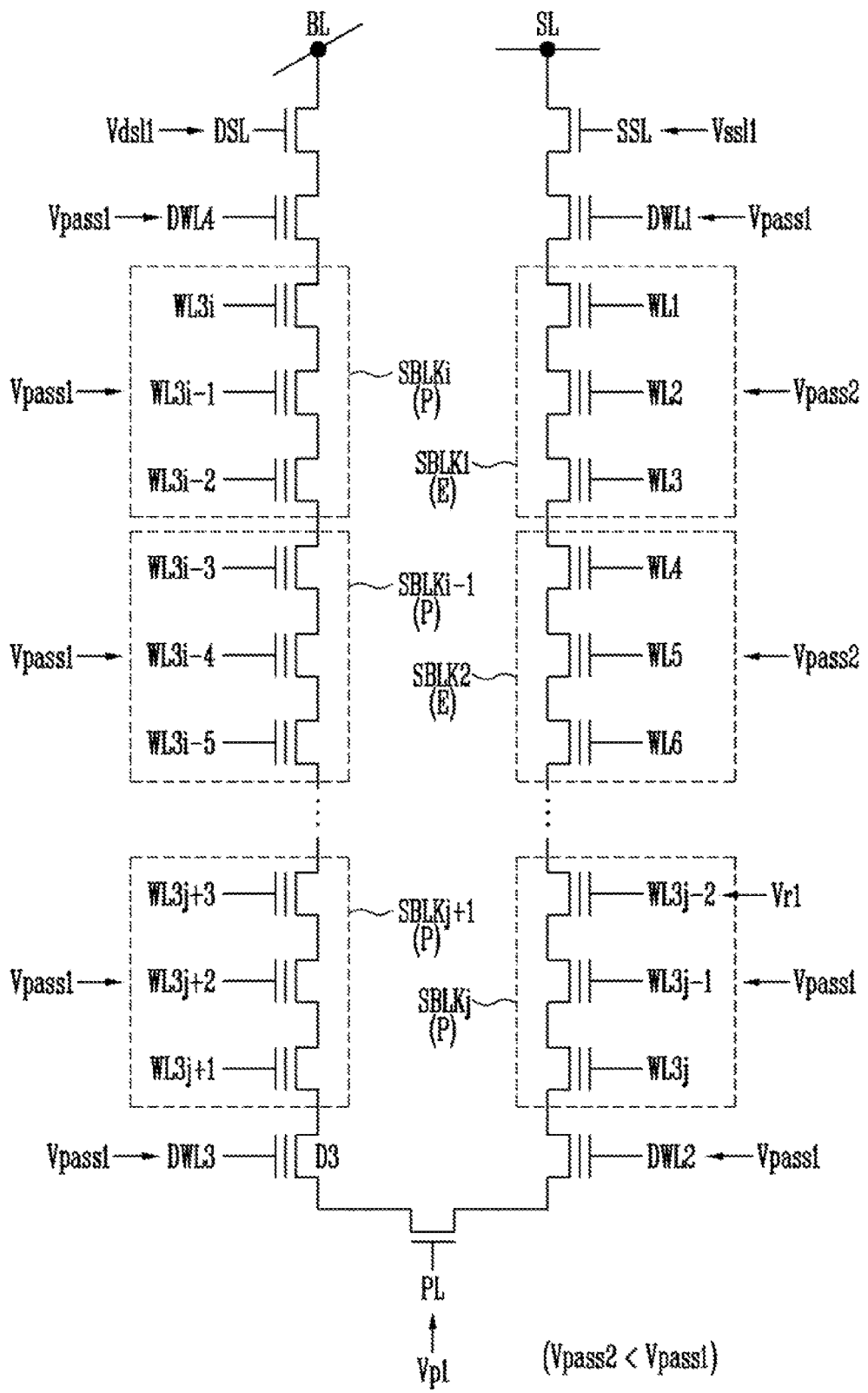

Referring to FIG. 9, the memory block may include first to ith sub-blocks SBLK1 to SBLKi (i is a positive integer). For example, first to jth sub-blocks SBLK1 to SBLKj (j is a positive integer) may be disposed between the pipe line PL and the source line SL, and (j+1)th to ith sub-blocks SBLKj+1 to SBLKi may be disposed between the pipe line PL and the bit line BL. When the first and second sub-blocks SBLK1 and SBLK2 among these sub-blocks are erased sub-blocks E, and the other third to ith sub-blocks SBLK3 to SBLKi are programmed sub-blocks P, the channel resistance of the erased first and second sub-blocks SBLK1 and SBLK2 may be lower than the channel resistance of the other third to ith sub-blocks SBLK3 to SBLKi. In this case, in the read operation on the selected jth sub-block SBLKj, the second pass voltage Vpass2 lower than the first pass voltage Vpass1 may be applied to the first to sixth word lines WL1 to WL6 coupled to the first and second sub-blocks SBLK1 and SBLK2 so as to increase the channel resistance. Voltages applied to the respective lines in the read operation on a selected memory cell included in the selected jth sub-block SBLKj will be described in detail as follows.

The read operation for a memory cell coupled to a (3j−2)th word line WL3j−2 among memory cells included in the jth sub-block SBLKj will be described as an example. The first read voltage Vr1 may be applied to the (3j−2)th word line WL3j−2 The second pass voltage Vpass2 having a lower level than the first pass voltage Vpass1 may be applied to the first to sixth word lines WL1 to WL6 coupled to the erased first and second sub-blocks SBLK1 and SBLK2, and the first pass voltage Vpass1 may be applied to the other unselected word lines WL7 to WL3j−3 and WL3j−1 to WL3i and the first to fourth dummy lines DWL1 to DWL4. The first pipe voltage Vp1 may be applied to the pipe line PL, and the first source turn-on voltage Vssl1 may be applied to the source select line SSL, and the first drain turn-on voltage Vdsl1 may be applied to the drain select line DSL.

If the second pass voltage Vpass2 having a lower level than the first pass voltage Vpass1 is applied to the first to sixth word lines WL1 to WL6 coupled to the erased first and second sub-blocks SBLK1 and SBLK2, the channel resistance of the first and second sub-blocks SBLK1 and SBLK2 is increased as coupling between the channel and the first to sixth word lines WLI1 to WL6 is decreased as compared with when the first pass voltage Vpass1 is applied. Thus, the read operation on the memory cell coupled to the selected (3j−2)th word line WL3j−2 may be performed by compensating for a decrease in channel resistance due to the erased first and second sub-blocks SBLK1 and SBLK2.

Also, the voltage difference between the first and second pass voltages Vpass1 and Vpass2 may be adjusted according to the number of erased sub-blocks in the selected memory block. For example, as the number of erased sub-blocks increases, the voltage difference may increase.

Figure 10:
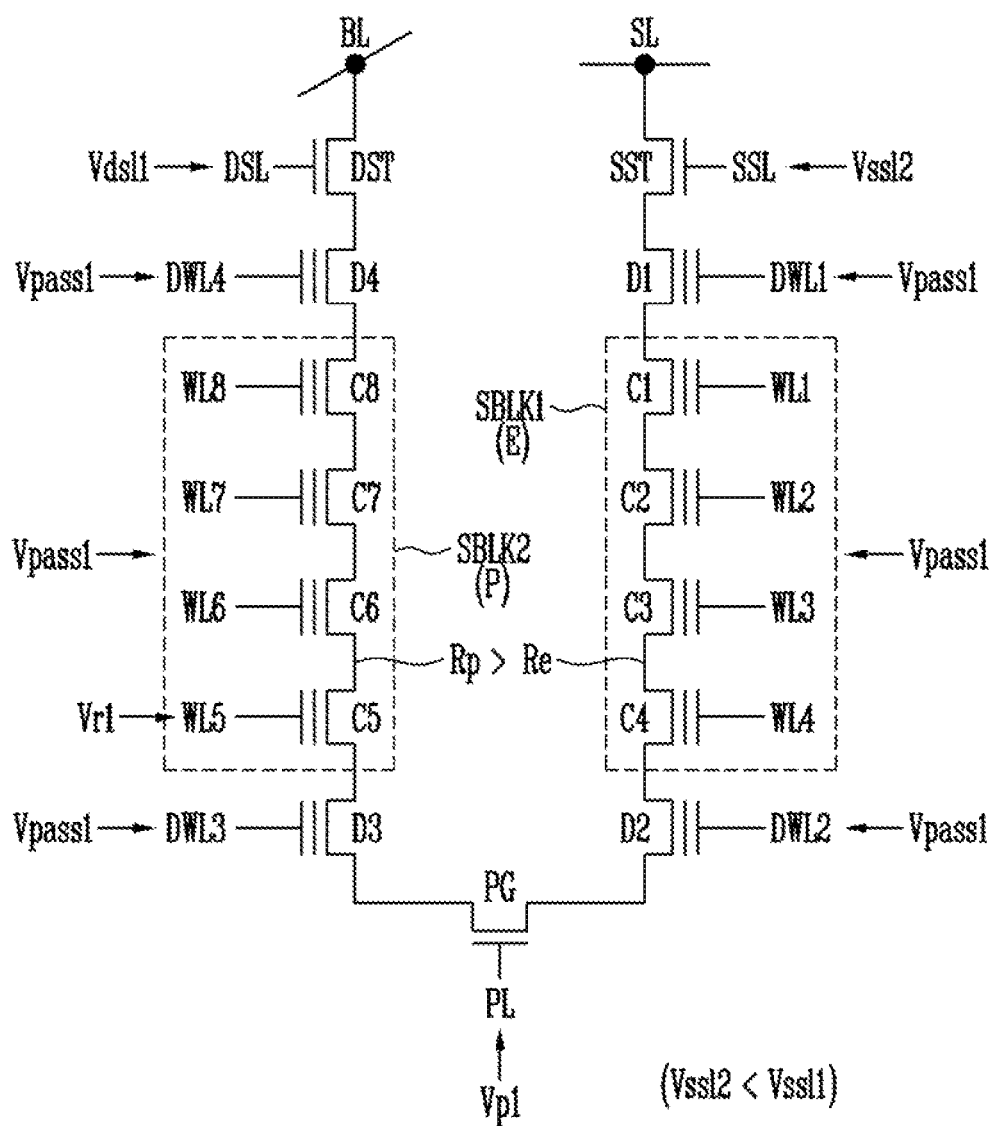

Referring to FIG. 10, when the first sub-block SBLK1 out of the first and second sub-blocks SBLK1 and SBL2 included in the selected memory block is an erased sub-block E, and the second sub-block SBLK2 out of the first and second sub-blocks SBLK1 and SBL2 included in the selected memory block is a programmed sub-block P, the channel resistance Re of the erased first sub-block SBLK1 may be lowered than the channel resistance Rp of the second sub-block SBLK2. In this case, in the read operation on the selected second sub-block SBLK2, a second source turn-on voltage Vssl2 lower than the first source turn-on voltage Vssl1 may be applied to the source select line SSL, or a second drain turn-on voltage Vdsl2 lower than the first drain turn-on voltage Vdsl1 may be applied to the drain select line DSL so as to increase the channel resistance. A case where the second source turn-on voltage Vssl2 is applied to the source select line SSL in the read operation for the fifth memory cell C5 included in the second sub-block SBLK2 out of the first and second sub-blocks SBLK1 and SBLK2 will be described as an example.

In the read operation for the fifth memory cell C5 included in the second sub-block SBLK2, the second source turn-on voltage Vssl2 lower than the first source turn-on voltage Vssl1 may be applied to the source select line SSL, and the first pass voltage Vpass1 may be applied to the first to fourth word lines WL1 to WL4 coupled to the first sub-block SBLK1. The first pipe voltage Vp1 may be applied to the pipe line PL, and the first pass voltage Vpass1 may be applied to the sixth to eighth word lines WL6 to WL8 and the first to fourth dummy lines DWL1 to DWL4. The first drain turn-on voltage Vdsl1 may be applied to the drain select line DSL, and the first read voltage Vr1 may be applied to the fifth word line WL5.

If the second source turn-on voltage Vssl2 lower than the first source turn-on voltage Vssl1 is applied to the source select line SSL, the channel resistance may be increased as coupling between the channel and the source select line SSL is decreased as compared with the first source turn-on voltage Vssl1 is applied. Thus, the read operation on the fifth memory cell C5 included in the second sub-block SBLK2 may be performed by compensating for a decrease in channel resistance due to the erased first sub-block SBLK1.

Figure 11:
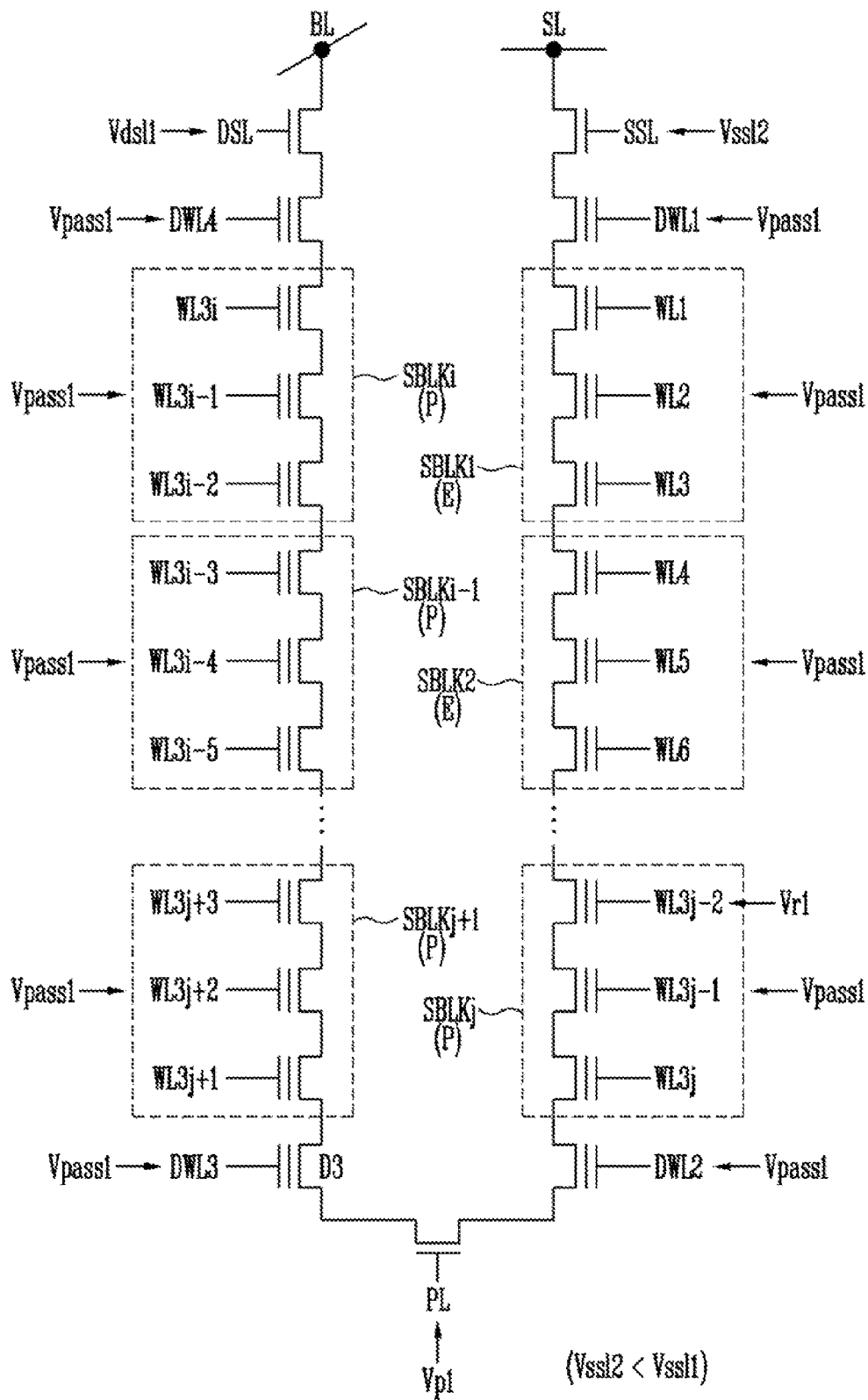

Referring to FIG. 11, the memory block may include first to ith sub-blocks SBLK1 to SBLKi (i is a positive integer). For example, first to jth sub-blocks SBLK1 to SBLKj (j is a positive integer) may be disposed between the pipe line PL and the source line SL, and (j+1)th to ith sub-blocks SBLKj+1 to SBLKi may be disposed between the pipe line PL and the bit line BL. When the first and second sub-blocks SBLK1 and SBLK2 among these sub-blocks are erased sub-blocks E, and the other third to ith sub-blocks SBLK3 to SBLKi are programmed sub-blocks P, the channel resistance of the erased first and second sub-blocks SBLK1 and SBLK2 may be lower than the channel resistance of the other third to ith sub-blocks SBLK3 to SBLKi. In this case, in the read operation on the selected jth sub-block SBLKj, the second source turn-on voltage Vssl2 lower than the first source turn-on voltage Vssl1 may be applied to the source select line SSL, or the second drain turn-on voltage Vdsl2 lower than the first drain turn-on voltage Vdsl1 may be applied to the drain select line DSL so as to increase the channel resistance. A case where the second source turn-on voltage Vssl2 is applied to the source select line SSL in the read operation for a selected memory cell included in the selected jth sub-block SBLKj will be described as an example.

The read operation for a memory cell coupled to the (3j−2)th word line WL3j−2 among memory cells included in the jth sub-block BLKj will be described as an example. The second source turn-on voltage Vssl2 lower than the first source turn-on voltage Vssl1 may be applied to the source select line SSL, and the first pass voltage Vpass1 may be applied to the unselected word lines WL1 to WL3j−3 and WL3j−1 to WL3i and the first to fourth dummy lines DWL1 to DWL4. The first pipe voltage Vp1 may be applied to the pipe line PL, and the first drain turn-on voltage Vdsl1 may be applied to the drain select line DSL. The first read voltage Vr1 may be applied to the selected (3j−2)th word line WL3j−2.

If the second source turn-on voltage Vssl2 lower than the first source turn-on voltage Vssl1 is applied to the source select line SSL, the channel resistance of the string is increased as coupling between the channel and the source select line SSL is decreased as compared with when the first source turn-on voltage Vssl1 is applied. Thus, the read operation on the memory cell coupled to the selected (3j−2)th word line WL3j−2 may be performed by compensating for a decrease in channel resistance due to the erased first and second sub-blocks SBLK1 and SBLK2.

Also, the voltage difference between the first and second source turn-on voltages Vssl1 and Vssl2 may be adjusted according to the number of erased sub-blocks in the selected memory block. For example, as the number of erased sub-blocks increases, the voltage difference may increase.

Figure 12:
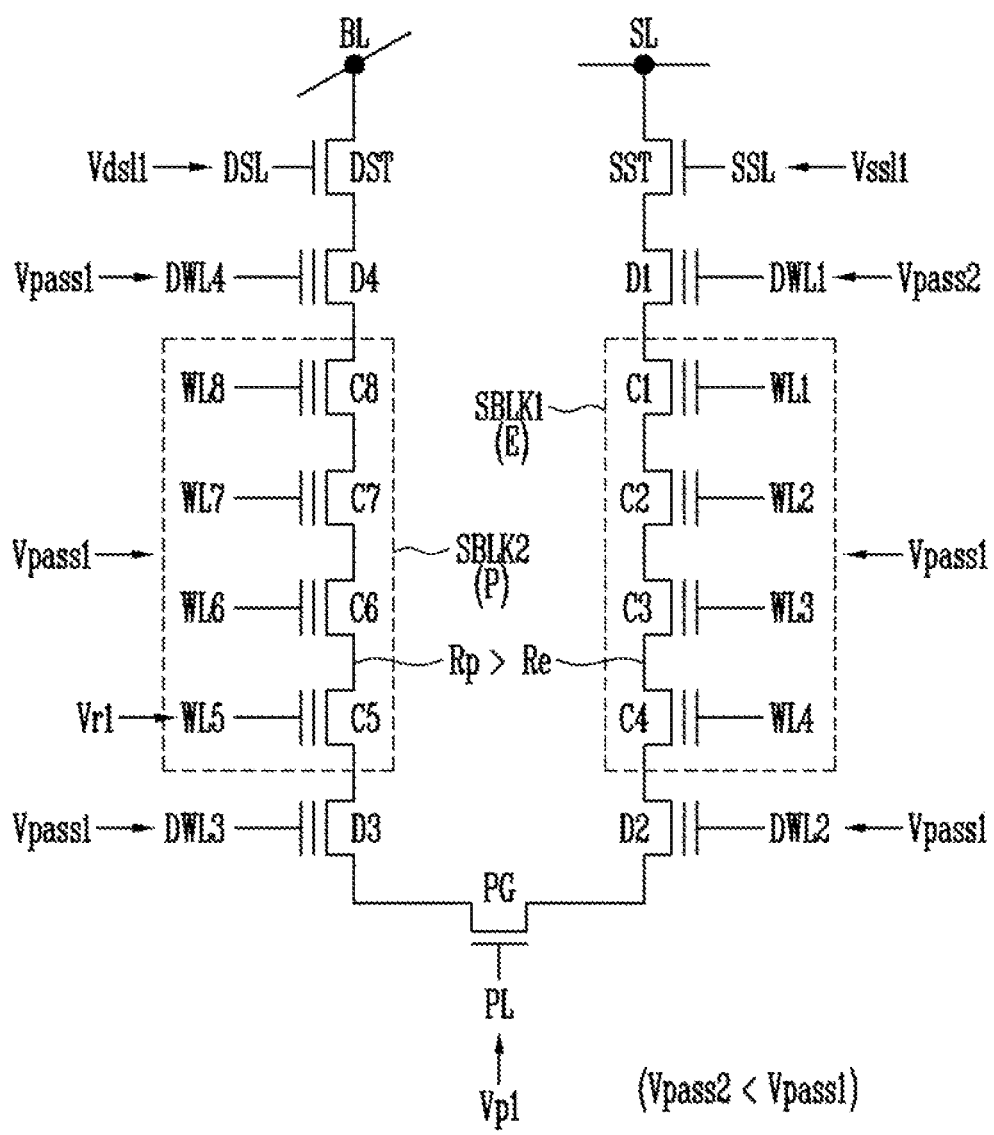

Referring to FIG. 12, when the first sub-block SBLK1 out of the first and second sub-blocks SBLK1 and SBL2 included in the selected memory block is an erased sub-block E, and the second sub-block SBLK2 out of the first and second sub-blocks SBLK1 and SBL2 included in the selected memory block is a programmed sub-block P, the channel resistance Re of the erased first sub-block SBLK1 may be lowered than the channel resistance Rp of the second sub-block SBLK2. In this case, in the read operation on the selected second sub-block SBLK2, the second pass voltage Vpass2 lower than the first pass voltage Vpass1 may be applied to at least one dummy line among the first to fourth dummy lines DWL1 to DWL4 so as to increase the channel resistance. The read operation for the fifth memory cell C5 included in the second sub-block SBLK2 will be described as an example.

In the read operation for the fifth memory cell C5 included in the second sub-block SBLK2, the second pass voltage Vpass2 lower than the first pass voltage Vpass1 may be applied to at least one dummy line among the first to fourth dummy lines DWL1 to DWL4. For example, the second pass voltage Vpass2 may be applied to the first dummy line DWL1, and the first pass voltage Vpass1 may be applied to the other second to fourth dummy lines DWL2 to DWL4. The first pipe voltage Vp1 may be applied to the pipe line PL, and the first pass voltage Vpass1 may be applied to the first to eighth word lines WL1 to WL8. The first source turn-on voltage Vssl1 may be applied to the source select line SSL, and the first drain turn-on voltage Vdsl1 may be applied to the drain select line DSL. The first read voltage Vr1 may be applied to the fifth word line WL5.

If the second pass voltage Vpass2 lower than the first pass voltage Vpass1 is applied to the first dummy line DWL1, the channel resistance of the string is increased as coupling between the channel and the first dummy line DWL1 is decreased as compared with when the first pass voltage Vpass1 is applied. Thus, the read operation on the fifth memory cell C5 included in the second sub-block SBLK2 may be performed by compensating for a decrease in channel resistance due to the erased first sub-block SBLK1.

Figure 13:
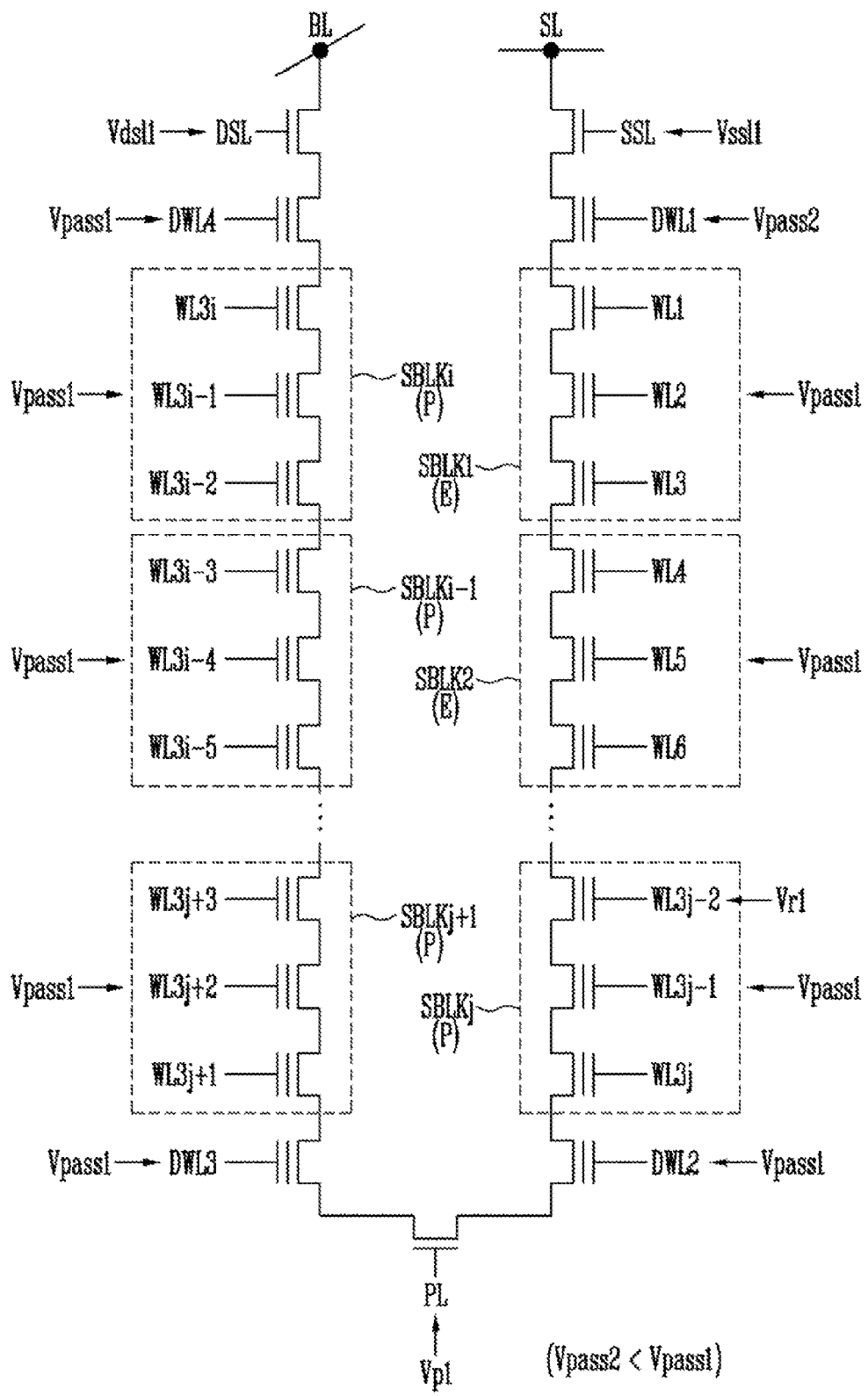

Referring to FIG. 13, the memory block may include first to ith sub-blocks SBLK1 to SBLKi (i is a positive integer). For example, first to jth sub-blocks SBLK1 to SBLKj (j is a positive integer) may be disposed between the pipe line PL and the source line SL, and (j+1)th to ith sub-blocks SBLKj+1 to SBLKi may be disposed between the pipe line PL and the bit line BL. When the first and second sub-blocks SBLK1 and SBLK2 among these sub-blocks are erased sub-blocks E, and the other third to ith sub-blocks SBLK3 to SBLKi are programmed sub-blocks P, the channel resistance of the erased first and second sub-blocks SBLK1 and SBLK2 may be lower than the channel resistance of the other third to ith sub-blocks SBLK3 to SBLKi. In this case, in the read operation on the selected jth sub-block SBLKj, the second pass voltage Vpass2 lower than the first pass voltage Vpass1 may be applied to at least one dummy line among the first to fourth dummy lines DWL1 to DWL4 so as to increase the channel resistance. Voltages applied to the respective lines in the read operation for a selected memory cell included in the selected jth sub-block SBLKj will be described in detail as follows.

The read operation for a memory cell coupled to the (3j−2)th word line WL3j−2 among memory cells included in the jth sub-block BLKj will be described as an example. The second pass voltage Vpass2 lower than the first pass voltage Vpass1 is applied to at least one dummy line among the first to fourth dummy lines DWL1 to DWL4. For example, the second pass voltage Vpass2 may be applied to the first dummy line DWL1, and the first pass voltage Vpass1 may be applied to the other second to fourth dummy lines DWL2 to DWL4. The first pass voltage Vpass1 may be applied to the unselected word lines WL1 to WL3j−3 and WL3j−1 to WL3i, and the first pipe voltage Vp1 may be applied to the pipe line PL. The first source turn-on voltage Vssl1 may be applied to the source select line SSL, and the first drain turn-on voltage Vdsl1 may be applied to the drain select line DSL. The first read voltage Vr1 may be applied to the selected (3j−2)th word line WL3j−2.

If the second pass voltage Vpass2 lower than the first pass voltage Vpass1 is applied to at least one dummy line among the first to fourth dummy lines DWL1 to DWL4, the channel resistance of the string is increased as compared with when the first pass voltage Vpass1 is applied to all the first to fourth dummy lines DWL1 to DWL4. Thus, the read operation on the selected memory cell may be performed by compensating for a decrease in channel resistance due to the erased first and second sub-blocks SBLK1 and SBLK2.

Also, the voltage difference between the first and second pass voltages Vpass1 and Vpass2 may be adjusted according to the number of erased sub-blocks in the selected memory block. For example, as the number of erased sub-blocks increases, the voltage difference may increase.

Figure 14:
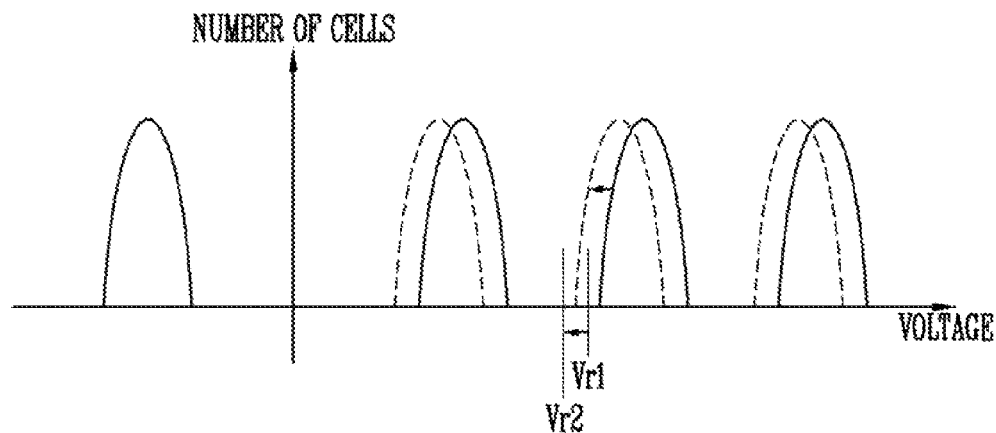

FIG. 14 is a diagram illustrating threshold voltages of memory cells when at least one erased sub-block is included in a memory block.

Referring to FIG. 14, if at least one erased sub-block is included in the memory block, the channel resistance of strings may be lowered by the erased sub-blocks. When assuming that a read voltage in consideration of a change in channel resistance is a first read voltage Vr1 and a read voltage in consideration of no change in channel resistance is a second read voltage Vr2, the second read voltage Vr2 is lower than the first read voltage Vr1, and may be set within the range of levels higher than those of threshold voltages distributed at a lower level than a target threshold voltage.

Embodiments using the second read voltage Vr2 will be described as follows.

Figure 15:
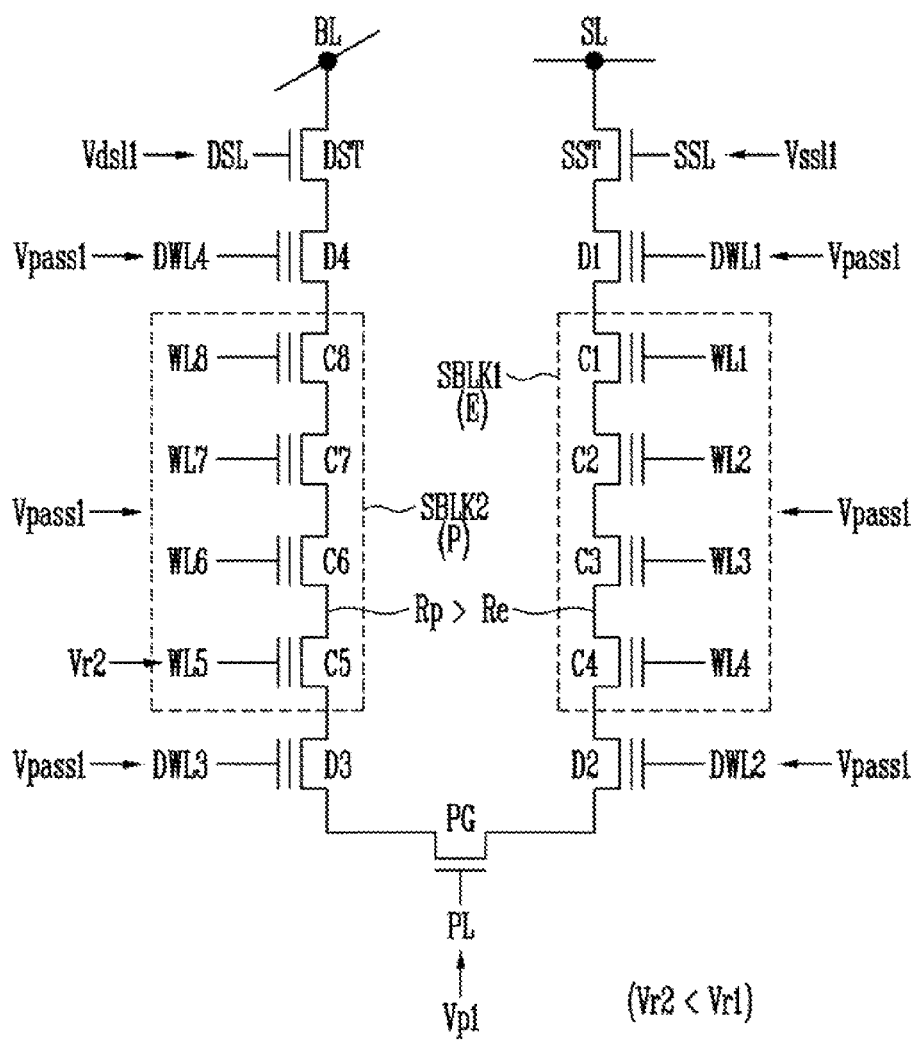

Referring to FIG. 15, when the first sub-block SBLK1 out of the first and second sub-blocks SBLK1 and SBL2 included in the selected memory block is an erased sub-block E, and the second sub-block SBLK2 out of the first and second sub-blocks SBLK1 and SBL2 included in the selected memory block is a programmed sub-block P, the channel resistance Re of the erased first sub-block SBLK1 may be lowered than the channel resistance Rp of the second sub-block SBLK2. In this case, in the read operation on the selected second sub-block SBLK2, the second read voltage Vr2 lower than the first read voltage Vr1 may be applied to the selected word line so as to increase the channel resistance. The read operation for the fifth memory cell C5 included in the second sub-block SBLK2 will be described as an example.

In the read operation for the fifth memory cell C5 included in the second sub-block SBLK2, the second read voltage Vr2 lower than the first read voltage Vr1 may be applied to the fifth word line WL5 coupled to the fifth memory cell C5. The first pass voltage Vpass1 may be applied to the first to fourth word lines WL1 to WL4, the sixth to eighth word lines WL6 to WL8, and the first to fourth dummy lines DWL1 to DWL4, and the first pipe voltage Vp1 may be applied to the pipe line PL. The first source turn-on voltage Vssl1 may be applied to the source select line SSL, and the first drain turn-on voltage Vdsl1 may be applied to the drain select line DSL.

If the second read voltage Vr2 lower than the first read voltage Vr1 is applied to the selected word line, the read operation may be performed by compensating for a change in channel resistance. Thus, it is possible to improve the reliability of the read operation on selected memory cells.

Figure 16:
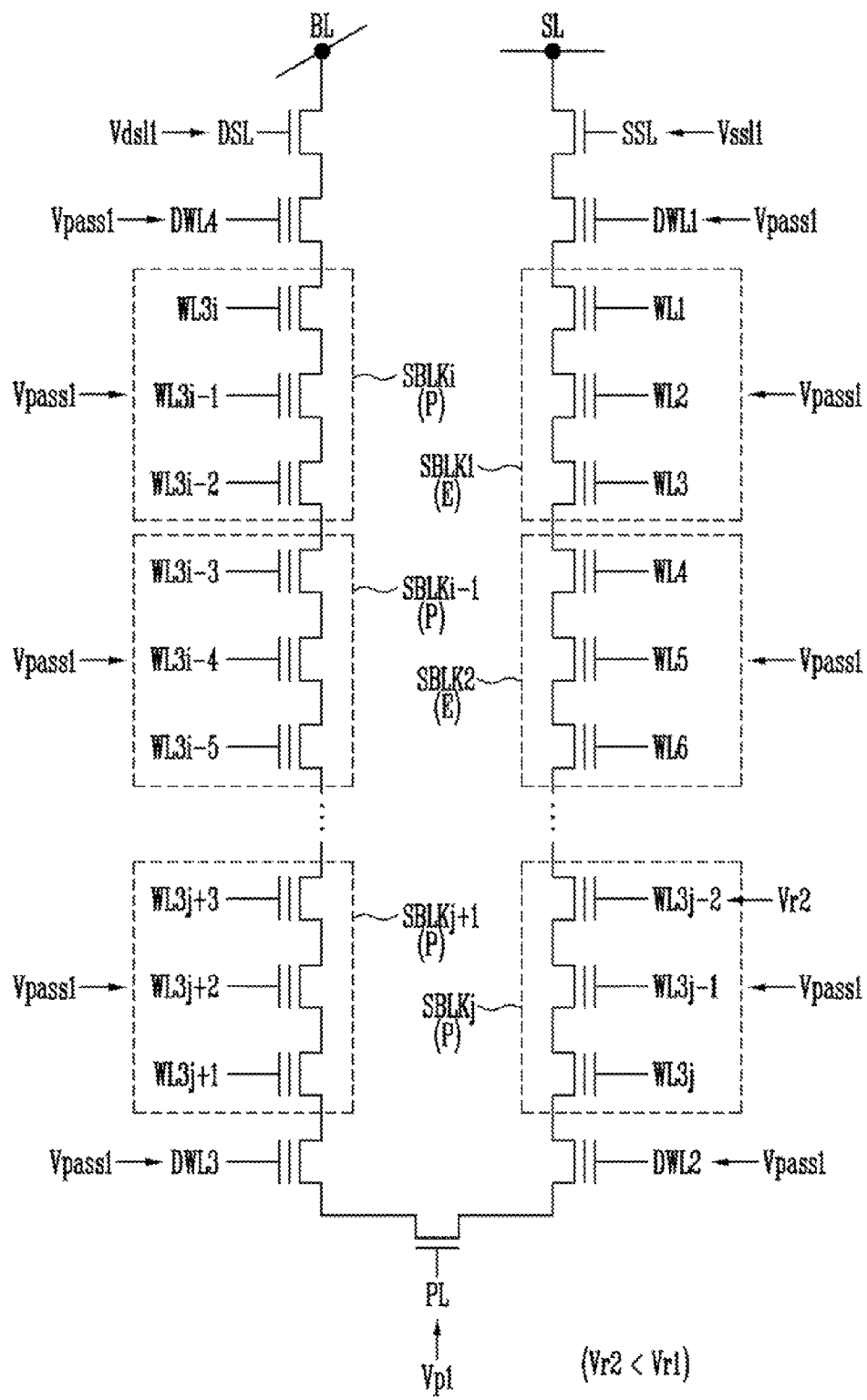

Referring to FIG. 16, the memory block may include first to ith sub-blocks SBLK1 to SBLKi (i is a positive integer). For example, first to jth sub-blocks SBLK1 to SBLKj (j is a positive integer) may be disposed between the pipe line PL and the source line SL, and (j+1)th to ith sub-blocks SBLKj+1 to SBLKi may be disposed between the pipe line PL and the bit line BL. When the first and second sub-blocks SBLK1 and SBLK2 among these sub-blocks are erased sub-blocks E, and the other third to ith sub-blocks SBLK3 to SBLKi are programmed sub-blocks P, the channel resistance of the erased first and second sub-blocks SBLK1 and SBLK2 may be lower than the channel resistance of the other third to ith sub-blocks SBLK3 to SBLKi. In this case, in the read operation on the selected jth sub-block SBLKj, the second read voltage Vr2 lower than the first read voltage Vr1 may be applied to the selected word line so as to increase the channel resistance. The read operation for the fifth memory cell C5 included in the second sub-block SBLK2 will be described as an example.

The read operation for a memory cell coupled to the (3j−2)th word line WL3j−2 among memory cells included in the jth sub-block BLKj will be described as an example. The second read voltage Vr2 lower than the first read voltage Vr1 may be applied to the selected (3j−2)th word line WL3j−2. The first pass voltage Vpass1 may be applied to the other unselected word lines WL1 to WL3j−3 and WL3j−1 to WL3i and the first to fourth dummy lines DWL1 to DWL4, and the first pipe voltage Vp1 may be applied to the pipe line PL. The first source turn-on voltage Vssl1 may be applied to the source select line SSL, and the first drain turn-on voltage Vdsl1 may be applied to the drain select line DSL.

If the second read voltage Vr2 lower than the first read voltage Vr1 is applied to the selected word line, the read operation may be performed by compensating for a change in channel resistance. Thus, it is possible to improve the reliability of the read operation on selected memory cells.

Also, the voltage difference between the first and second read voltages Vr1 and Vr2 may be adjusted according to the number of erased sub-blocks in the selected memory block. For example, as the number of erased sub-blocks increases, the voltage difference may increase.

FIGS. 17 to 24 are diagrams for describing various embodiments of the read operation on the memory block having the BiCS structure.

Figure 17:
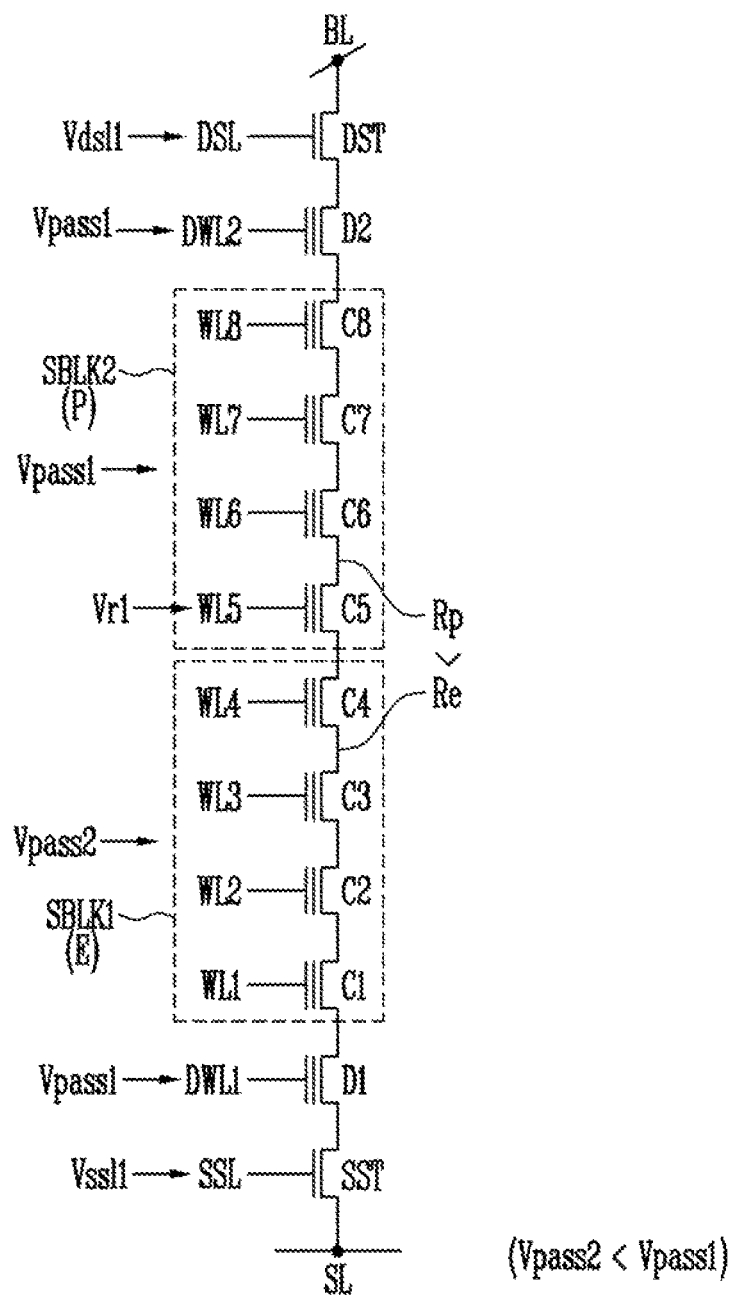
FIGS. 17 to 24 are diagrams describing a read operation on a memory block having a BiCS structure, according to various embodiments of the present disclosure.

Referring to FIG. 17, when the first sub-block SBLK1 out of the first and second sub-blocks SBLK1 and SBL2 included in the selected memory block is an erased sub-block E, and the second sub-block SBLK2 out of the first and second sub-blocks SBLK1 and SBL2 included in the selected memory block is a programmed sub-block P, the channel resistance Re of the erased first sub-block SBLK1 may be lowered than the channel resistance Rp of the second sub-block SBLK2. In this case, in the read operation on the selected second sub-block SBLK2, the second pass voltage Vpass2 lower than the first pass voltage Vpass1 may be applied to the first to fourth word lines WL1 to WL4 coupled to the first sub-block SBLK1 so as to increase the channel resistance. The read operation for the fifth memory cell C5 included in the second sub-block SBLK2 out of the first and second sub-blocks SBLK1 and SBLK2 will be described as an example.

In the read operation for the fifth memory cell C5 included in the second sub-block SBLK2, the second pass voltage Vpass2 having a lower level than the first pass voltage Vpass1 may be applied to the first to fourth dummy lines DWL1 to DWL4 coupled to the first sub-block SBLK1, and the first pass voltage Vpass1 maybe applied to the sixth to eighth word lines WL6 to WL8 and the first and second dummy lines DWL1 and DWL2. The first source turn-on voltage Vssl1 may be applied to the source select line SSL, and the first drain turn-on voltage Vdsl1 may be applied to the drain select line DSL. The first read voltage Vr1 may be applied to the fifth word line WL5.

If the second pass voltage Vpass2 having a lower level than the first pass voltage Vpass1 is applied to the first to fourth word lines WL1 to WL4 coupled to the erased first sub-block SBLK1, the channel resistance Re of the first sub-block SBLK1 is increased as coupling between the channel and the first to fourth word lines WL1 to WL4 is decreased as compared with when the first pass voltage Vpass1 is applied. Thus, the read operation on the fifth memory cell C5 included in the second sub-block SBLK2 may be performed by compensating for a decreased in channel resistance due to the erased first sub-block SBLK1.

Figure 18:
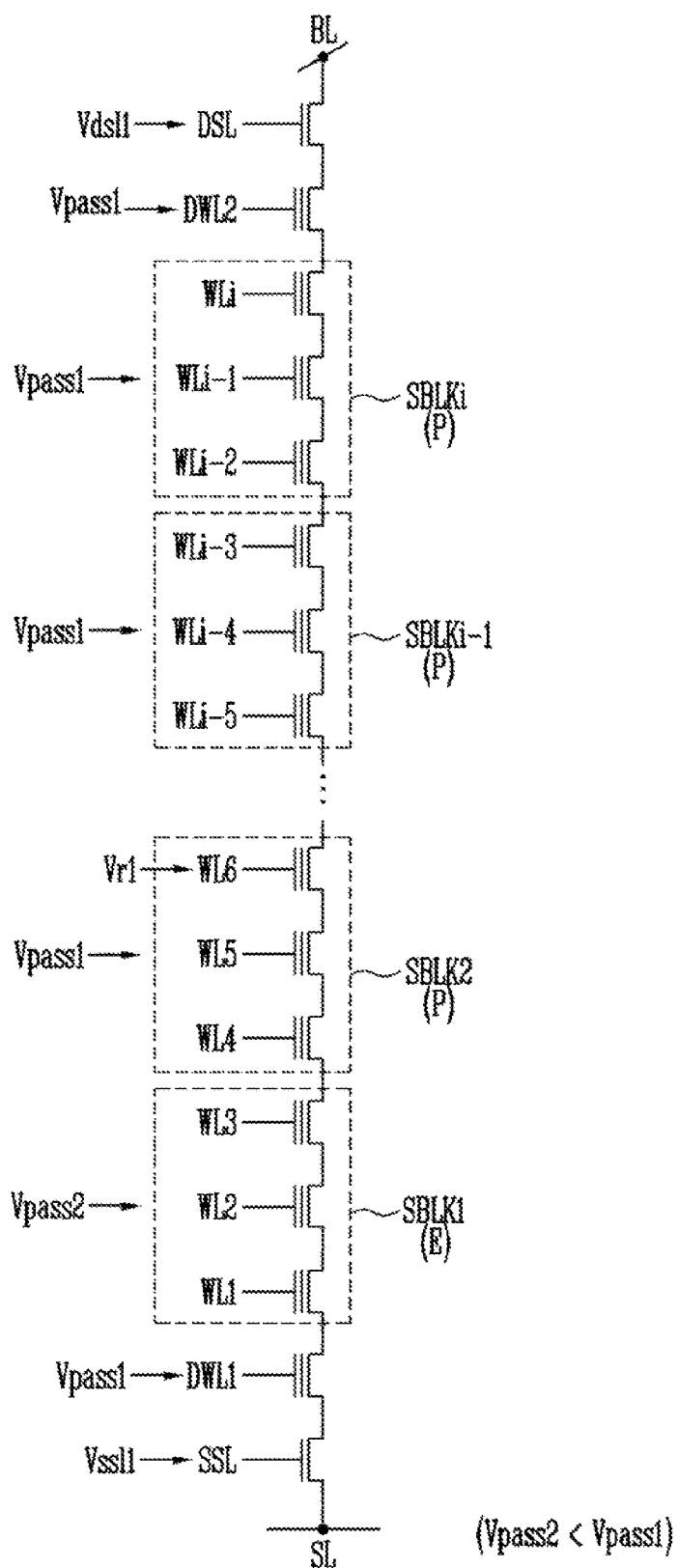

Referring to FIG. 18, when the first sub-block SBLK1 among the first to ith sub-blocks SBLK1 to SBLKi included in the selected memory block is an erased sub-block E, and the other second to ith sub-blocks SBLK2 to SBLKi are programmed sub-blocks P, the channel resistance of the erased first sub-block SBLK1 may be lowered than the channel resistance of the other second to ith sub-blocks SBLK2 to SBLKi. In this case, in the read operation on the selected second sub-block SBLK2, the second pass voltage Vpass2 lower than the first pass voltage Vpass1 may be applied to the first to third word lines WL1 to WL3 coupled to the first sub-block SBLK1 so as to increase the channel resistance. The read operation for a memory cell coupled to the sixth word line WL6 will be described as an example.

In the read operation for the memory cell coupled to the sixth word line WL6, the second pass voltage Vpass2 having a lower level than the first pass voltage Vpass1 may be applied to the first to third word lines WL1 to WL3 coupled to the first sub-block SBLK1, and the first pass voltage Vpass1 may be applied to the fourth, fifth, and seventh to ith word lines WL4, WL5 and WL7 to WLi and the first and second dummy lines DWL1 and DWL2. The first source turn-on voltage Vssl1 may be applied to the source select line SSL, and the first drain turn-on voltage Vdsl1 may be applied to the drain select line DSL. The first read voltage Vr1 may be applied to the sixth word line WL6.

If the second pass voltage Vpass2 having a lower level than the first pass voltage Vpass1 is applied to the first to third word lines WL1 to WL3 coupled to the erased first sub-block SBLK1, the channel resistance of the first sub-block SBLK1 is increased as coupling between the channel and the first to third word lines WL1 to WL3 is decreased as compared with when the first pass voltage Vpass1 is applied. Thus, the read operation on the memory cell coupled to the sixth word line WL6 may be performed by compensating for a decreased in channel resistance due to the erased first sub-block SBLK1.

Also, the voltage difference between the first and second pass voltages Vpass1 and Vpass2 may be adjusted according to the number of erased sub-blocks in the selected memory block. For example, as the number of erased sub-blocks increases, the voltage difference may increase.

Figure 19:
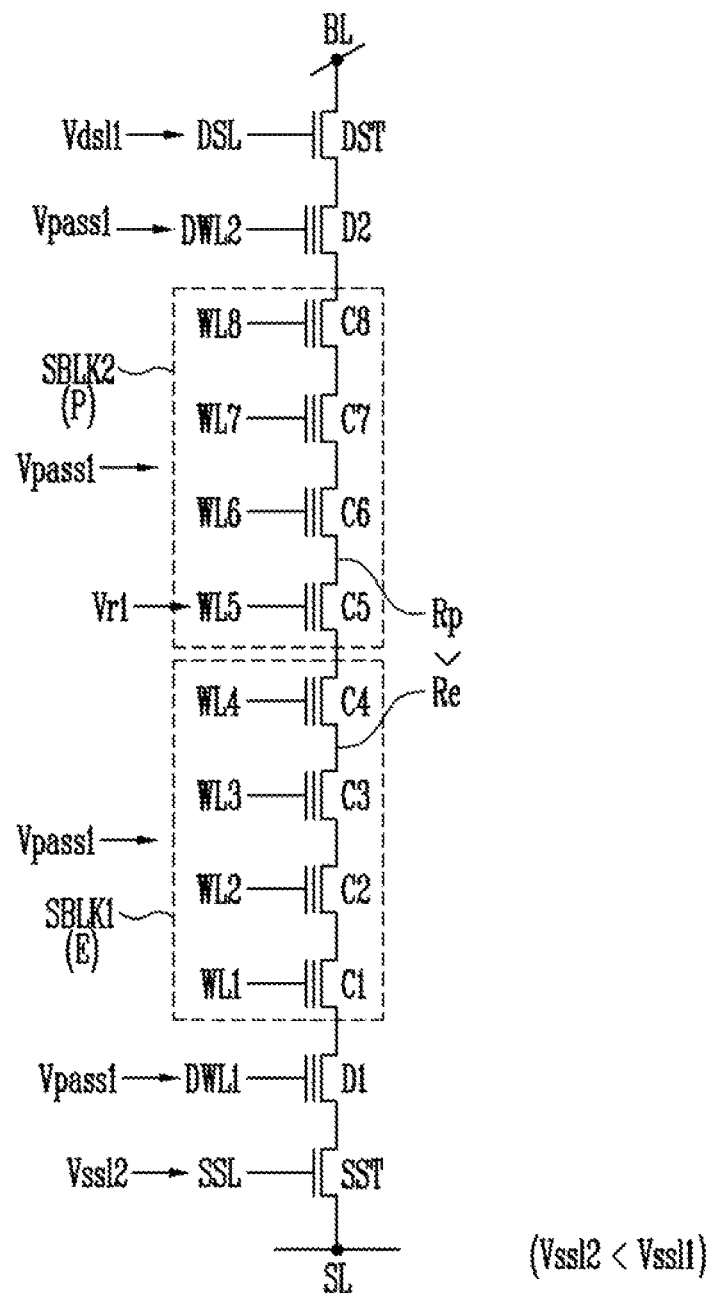

Referring to FIG. 19, when the first sub-block SBLK1 out of the first and second sub-blocks SBLK1 and SBLK2 included in the selected memory block is an erased sub-block E, and the second sub-block SBLK2 is a programmed sub-block P, the channel resistance of the erased first sub-block SBLK1 may be lowered than the channel resistance of the second sub-block SBLK2. In this case, in the read operation on the selected second sub-block SBLK2, the second source turn-on voltage Vssl2 lower than the first source turn-on voltage Vssl1 may be applied to the source select line SSL, or the second drain turn-on voltage Vdsl2 lower than the first drain turn-on voltage Vdsl1 may be applied to the drain select line DSL so as to increase the channel resistance. A case the second source turn-on voltage Vssl2 is applied to the source select line SSL in the read operation for the fifth memory cell C5 included in the second sub-block SBLK2 out of the first and second sub-blocks SBLK1 and SBLK2 will be described as an example.

In the read operation for the fifth memory cell C5 included in the second sub-block SBLK2, the second source turn-on voltage Vssl2 lower than the first source turn-on voltage Vssl1 may be applied to the source select line SSL, and the first pass voltage Vpass1 may be applied to the first to fourth word lines WL1 to WL4 coupled to the first sub-block SBLK1, the sixth to eighth word lined WL6 to WL8 coupled to the second sub-block SBLK2, and the first and second dummy lines DWL1 and DWL2. The first drain turn-on voltage Vdsl1 may be applied to the drain select line DSL, and the first read voltage Vr1 may be applied to the fifth word line WL5.

If the second source turn-on voltage Vssl2 lower than the first source turn-on voltage Vssl1 is applied to the source select line SSL, the channel resistance of the string is increased as coupling between the channel and the source select line SSL is decreased as compared with the first source turn-on voltage Vssl1 is applied. Thus, the read operation on the fifth memory cell C5 included in the second sub-block SBLK2 may be performed by compensating for a decrease in channel resistance due to the erased first sub-block SBLK1.

Figure 20:
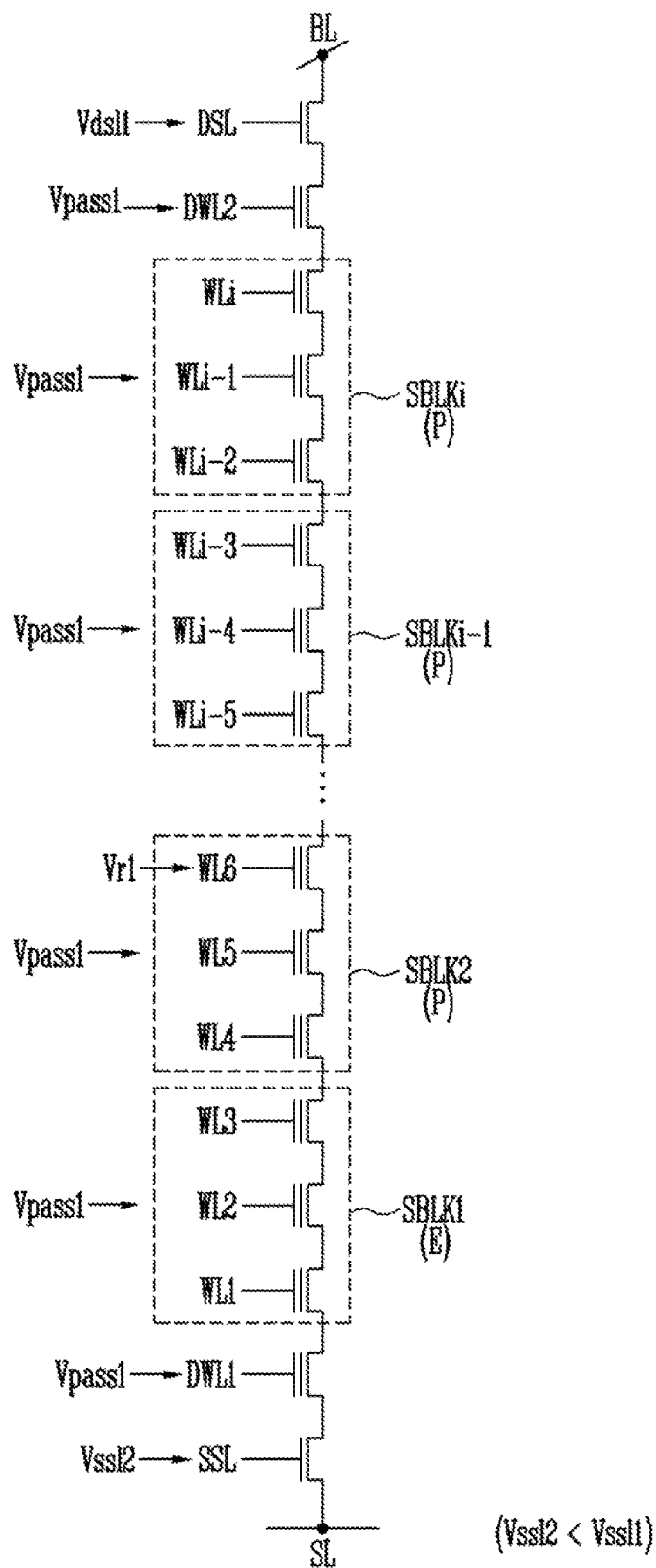

Referring to FIG. 20, when the first sub-block SBLK1 among the first to ith sub-blocks SBLK1 to SBLKi included in the selected memory block is an erased sub-block E, and the other second to ith sub-blocks SBLK2 to SBLKi are programmed sub-blocks P, the channel resistance of the erased first sub-block SBLK1 may be lowered than the channel resistance of the other second to ith sub-blocks SBLK2 to SBLKi. In this case, in the read operation on the selected second sub-block SBLK2, the second source turn-on voltage Vssl2 lower than the first source turn-on voltage Vssl1 may be applied to the source select line SSL, or the second drain turn-on voltage Vdsl2 lower than the first drain turn-on voltage Vdsl1 may be applied to the drain select line DSL so as to increase the channel resistance. A case where the second source turn-on voltage Vssl2 is applied to the source select line SSL in the read operation for a memory cell coupled to the sixth word line WL6 will be described as an example.

In the read operation for the memory cell coupled to the selected sixth word line WL6, the second source turn-on voltage Vssl2 lower than the first source turn-on voltage Vssl1 may be applied to the source select line SSL, and the first pass voltage Vpass1 may be applied to the unselected first to fifth word lines WL1 to WL5, the seventh to ith word lines WL7 to WLi, and the first and second dummy lines DWL1 and DWL2. The first drain turn-on voltage Vdsl1 may be applied to the drain select line DSL, and the first read voltage Vr1 may be applied to the selected sixth word line WL6.

If the second source turn-on voltage Vssl2 lower than the first source turn-on voltage Vssl1 is applied to the source select line SSL, the channel resistance of the string is increased as coupling between the channel and the source select line SSL is decreased as compared with when the first source turn-on voltage Vssl1 is applied. Thus, the read operation on the memory cell coupled to the sixth word line WL6 may be performed by compensating for a decreased in channel resistance due to the erased first sub-block SBLK1.

Also, the voltage difference between the first and second source turn-on voltages Vssl1 and Vssl2 may be adjusted according to the number of erased sub-blocks in the selected memory block. For example, as the number of erased sub-blocks increases, the voltage difference may increase.

Figure 21:
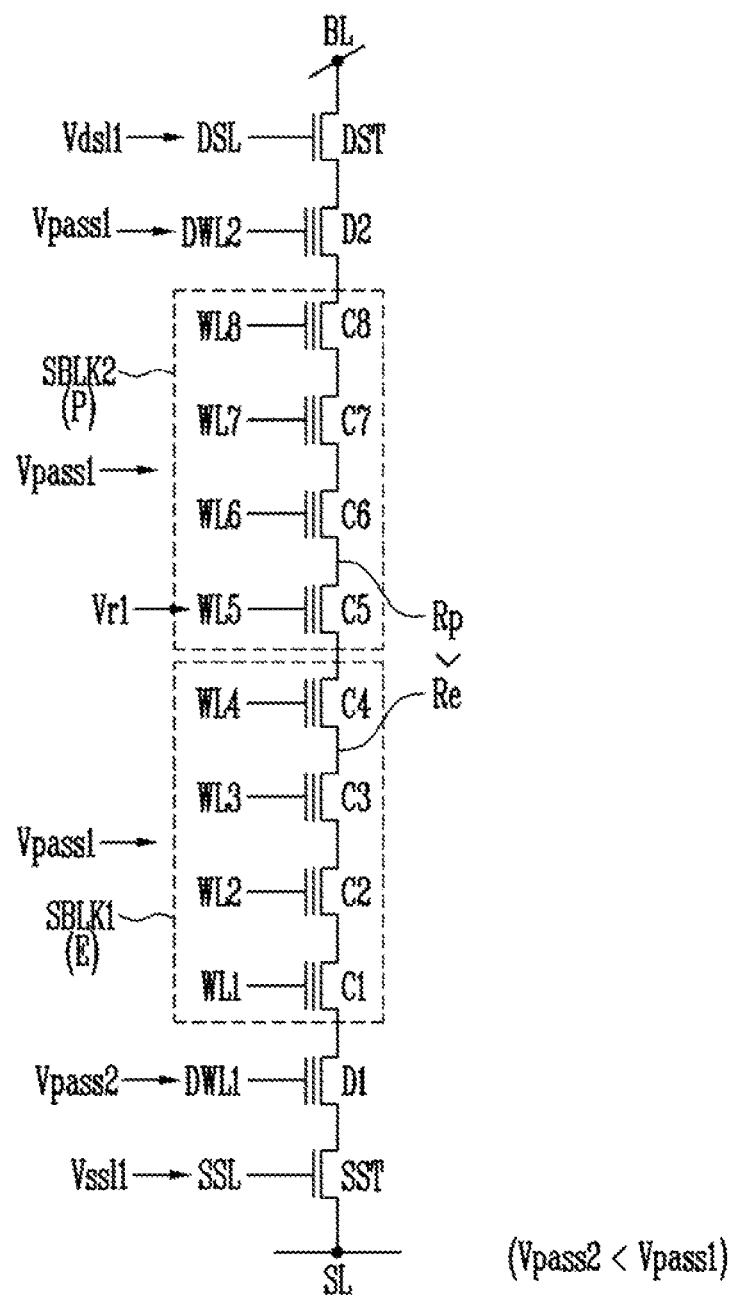

Referring to FIG. 21, when the first sub-block SBLK1 out of the first and second sub-blocks SBLK1 and SBLK2 included in the selected memory block is an erased sub-block E, and the second sub-block SBLK2 is a programmed sub-block P, the channel resistance Re of the erased first sub-block SBLK1 may be lowered than the channel resistance Rp of the second sub-block SBLK2. In this case, in the read operation on the selected second sub-block SBLK2, the second pass voltage Vpass2 lower than the first pass voltage Vpass1 may be applied to at least one dummy line out of the first and second dummy lines DWL1 and DWL2 so as to increase the channel resistance. The read operation for the fifth memory cell C5 included in the second sub-block SBLK2 out of the first and second sub-blocks SBLK1 and SBLK2 will be described as an example.

In the read operation for the fifth memory cell C5 included in the second sub-block SBLK2, the second pass voltage Vpass2 lower than the first pass voltage Vpass1 may be applied to the first dummy line DWL1, and the first pass voltage Vpass1 may be applied to the second dummy line DWL2 and the first to eighth word lines WL1 to WL8. The first source turn-on voltage Vssl1 may be applied to the source select line SSL, and the first drain turn-on voltage Vdsl1 may be applied to the drain select line DSL. The first read voltage Vr1 may be applied to the fifth word line WL5.

If the second pass voltage Vpass2 lower than the first pass voltage Vpass1 is applied to the first dummy line DWL1, the channel resistance of the string is increased as coupling between the channel and the firs dummy line DWL1 is decreased as compared with when the first pass voltage Vpass1 is applied. Thus, the read operation on the selected memory cell included in the selected memory cell may be performed by compensating for a decrease in channel resistance due to the erased first sub-block SBLK1.

Figure 22:
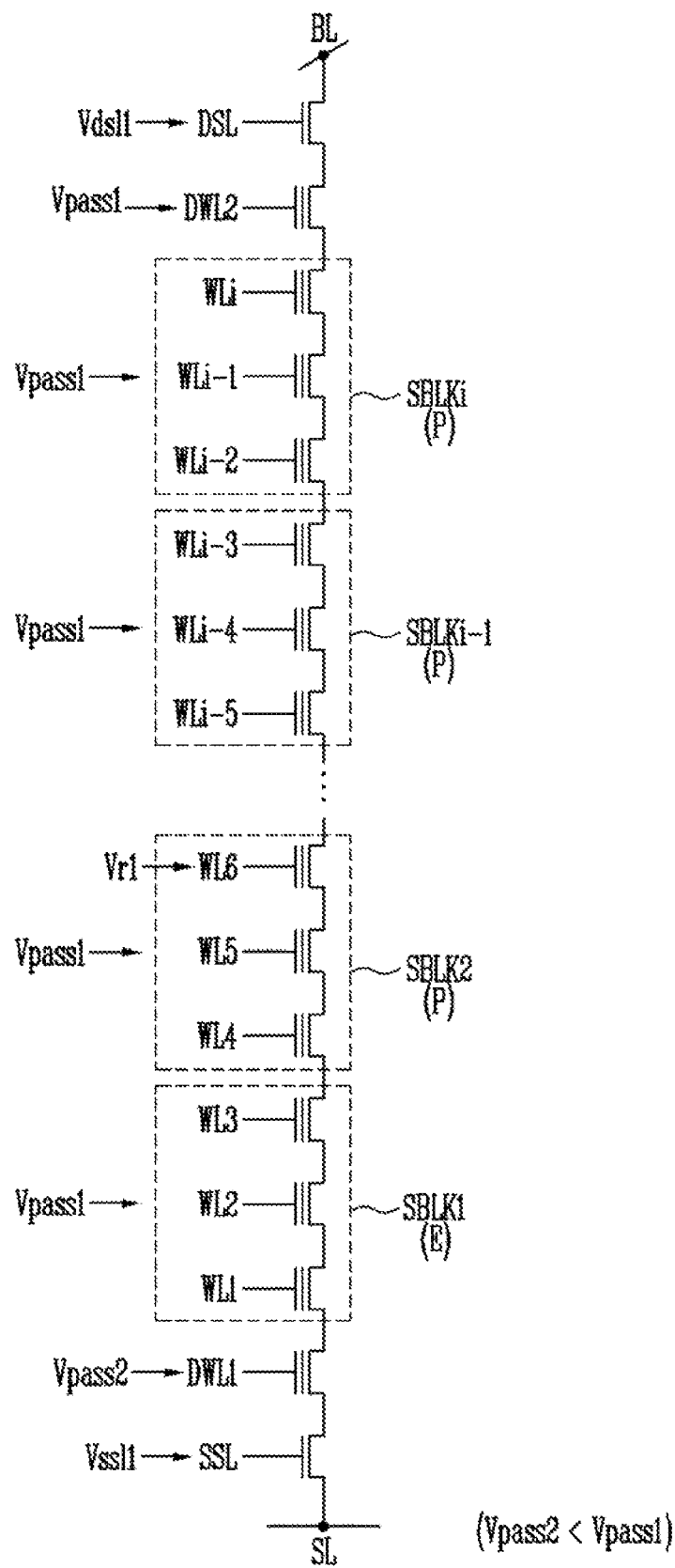

Referring to FIG. 22, when the first sub-block SBLK1 among the first to ith sub-blocks SBLK1 to SBLKi included in the selected memory block is an erased sub-block E, and the other second to ith sub-blocks SBLK2 to SBLKi are programmed sub-blocks P, the channel resistance of the erased first sub-block SBLK1 may be lowered than the channel resistance of the other second to ith sub-blocks SBLK2 to SBLKi. In this case, in the read operation on the selected second sub-block SBLK2, the second pass voltage Vpass2 lower than the first pass voltage Vpass1 may be applied to at least one dummy line out of the first and second dummy lines DWL1 and DWL2 so as to increase the channel resistance. The read operation for a memory cell coupled to the sixth word line WL6 will be described as an example.

In the read operation for the memory cell coupled to the sixth word line WL6, the second pass voltage Vpass2 lower than the first pass voltage Vpass1 may be applied to the first dummy line DWL1, and the first pass voltage Vpass1 may be applied to the second dummy line DWL2, the first to fifth word lines WL1 to WL5, and the seventh to ith word lines WL7 to WLi. The first source turn-on voltage Vssl1 may be applied to the source select line SSL, and the first drain turn-on voltage Vdsl1 may be applied to the drain select line DSL. The first read voltage Vr1 may be applied to the sixth word line WL6.

If the second pass voltage Vpass2 lower than the first pass voltage Vpass1 is applied to the first dummy line DWL1, the channel resistance of the string is increased as coupling between the channel and the first dummy line DWL1 is decreased as compared with when the first pass voltage Vpass1 is commonly applied to the first and second dummy lines DWL1 and DWL2. Thus, the read operation on the selected memory cell may be performed by compensating for a decrease in channel resistance due to the erased sub-block.

Figure 23:
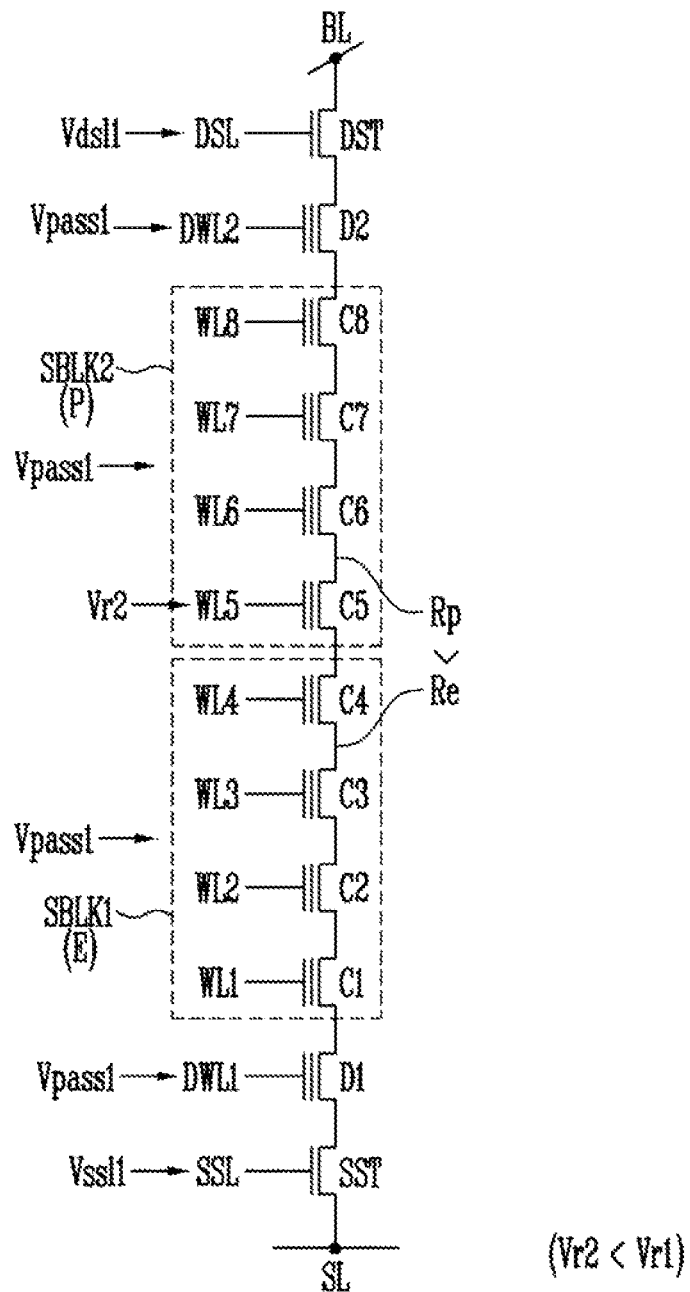

Referring to FIG. 23, when the first sub-block SBLK1 out of the first and second sub-blocks SBLK1 and SBLK2 included in the selected memory block is an erased sub-block E, and the second sub-block SBLK2 is a programmed sub-block P, the channel resistance Re of the erased first sub-block SBLK1 may be lowered than the channel resistance Rp of the second sub-block SBLK2. In this case, in the read operation on the selected second sub-block SBLK2, the second read voltage Vr2 lower than the first read voltage Vr1 may be applied to the selected word line so as to increase the channel resistance. The read operation for the fifth memory cell C5 included in the second sub-block SBLK2 out of the first and second sub-blocks SBLK1 and SBLK2 will be described as an example.

In the read operation for the fifth memory cell C5 included in the second sub-block SBLK2, the second read voltage Vr2 lower than the first lead voltage Vr1 may be applied to the selected word line WL5. The first pass voltage Vpass1 may be applied to the other unselected first to fourth word lines WL1 to WL4, the sixth to eighth word lines WL6 to WL8, and the first and second dummy lines DWL1 and DWL2, and the first source turn-on voltage Vssl1 may be applied to the source select line SSL. The first drain turn-on voltage Vdsl1 may be applied to the drain select line DSL.

If the second read voltage Vr2 lower than first read voltage Vr1 is applied to the selected word line, the read operation may be performed by compensating for a change in channel resistance, thereby improving the reliability of the read operation on selected memory cells.

Figure 24:
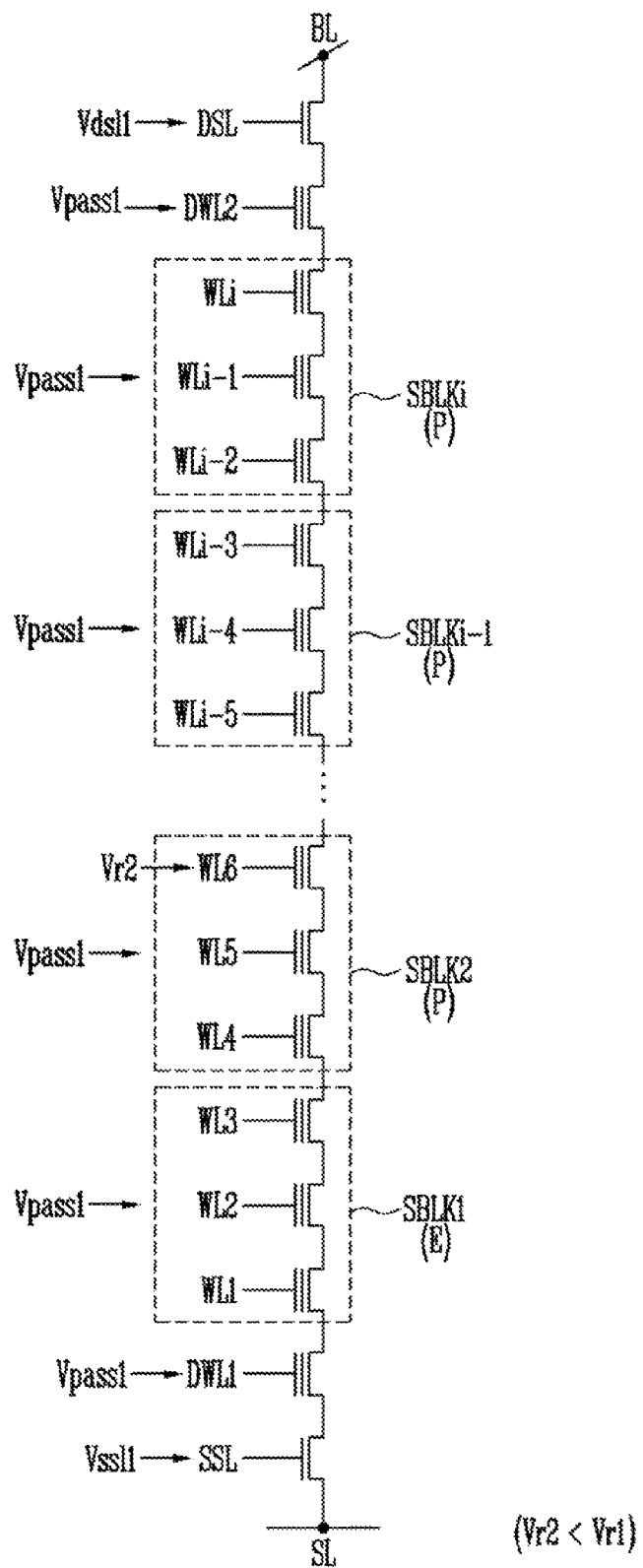

Referring to FIG. 24, when the first sub-block SBLK1 among the first to ith sub-blocks SBLK1 to SBLKi included in the selected memory block is an erased sub-block E, and the other second to ith sub-blocks SBLK2 to SBLKi are programmed sub-blocks P, the channel resistance of the erased first sub-block SBLK1 may be lowered than the channel resistance of the other second to ith sub-blocks SBLK2 to SBLKi. In this case, in the read operation on the selected second sub-block SBLK2, the second read voltage Vr2 lower than the first read voltage Vr1 may be applied to the selected word line so as to increase the channel resistance. The read operation for a memory cell coupled to the sixth word line WL6 will be described as an example.

In the read operation for the memory cell coupled to the sixth word line WL6, the second read voltage Vr2 lower than the first read voltage Vr1 may be applied to the selected sixth word line WL6. The first pass voltage Vpass1 may be applied to the other unselected first to fifth word lines WL1 to WL5, the seventh to ith word lines WL7 to WLi, and the first and second dummy lines DWL1 and DWL2, and the first source turn-on voltage Vssl1 may be applied to the source select line SSL. The first drain turn-on voltage Vdsl1 may be applied to the drain select line DSL.

If the second read voltage Vr2 lower than the first read voltage Vr1 is applied to the selected word line, the read operation may be performed by compensating for a change in channel resistance, thereby improving the reliability of the read operation on selected memory cells.

Also, the voltage difference between the first and second read voltages Vr1 and Vr2 may be adjusted according to the number of erased sub-blocks in the selected memory block. For example, as the number of erased sub-blocks increases, the voltage difference may increase.

In the above, the methods for decreasing any one of the pipe voltage, the pass voltage, the turn-on voltage, and the read voltage to be lower than the reference level in the read operation have been described. However, the read operation may be performed by combining the above-described methods.

Figure 25:
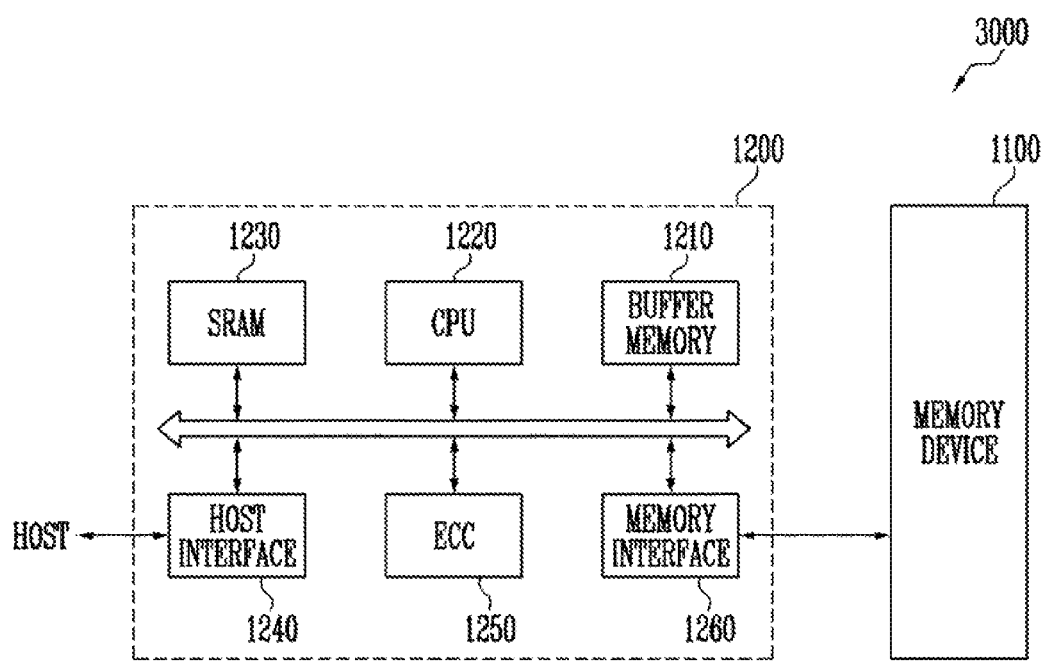
FIG. 25 is a diagram illustrating a memory system, according to an embodiment of the present disclosure.

FIG. 25 is a diagram illustrating a memory system 3000 according to an embodiment of the present disclosure.

Referring to FIG. 25, the memory system 3000 may include a memory device 1100 for storing data and a memory controller 1200 for controlling the memory device 1100. Also, the memory controller 1200 may control communication between a host and the memory device 1100. The memory controller 1200 may include a buffer memory 1210, a CPU 1220, an SRAM 1230, a host interface 1240, an ECC 1250, and a memory interface 1260.

The buffer memory 1210 temporarily stores data while the memory controller 1200 may control the memory device 1100. The CPU 1220 may perform a control operation for data exchange of the memory controller 1200. The SRAM 1230 may be used as a working memory of the CPU 1220. The host interface 1240 may be provided with a data exchange protocol of the host coupled to the memory system 3000. The ECC 1250 is an error correction unit, and may detect and correct errors included in data read out from the memory device 1100. The semiconductor interface 1260 may interface with the memory device 1100. Although not shown in FIG. 25, the memory system 3000 may further include a ROM (not shown) for storing code data for interfacing with the host.

The host may include a computer, a ultra mobile PC (UMPC), a workstation, a net-book, a personal digital assistant (PDA), a portable computer, a web tablet, a wireless phone, a mobile phone, a smart phone, a digital camera, a digital audio recorder, a digital audio player, a digital video recorder, a digital video player, a device capable of transmitting/receiving information in a wireless environment, and one of various electronic devices that constitute a home network.

Figure 26:
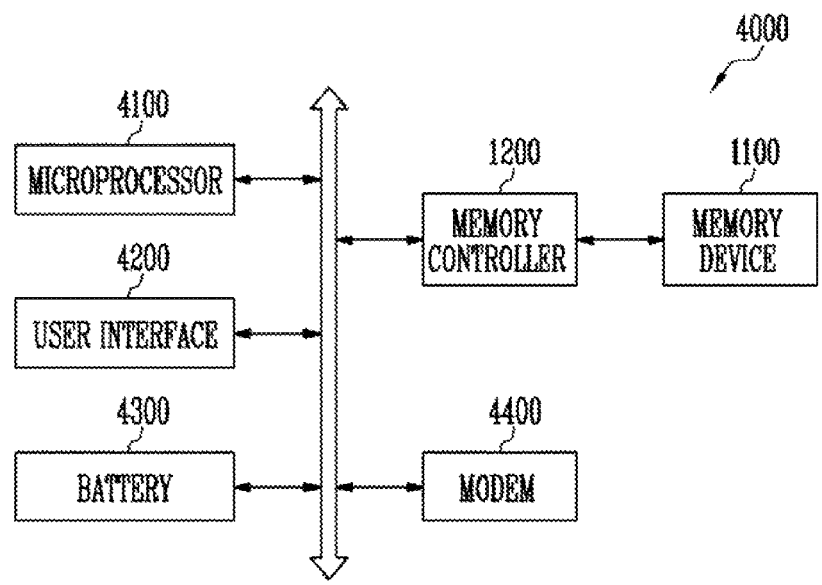
FIG. 26 is a diagram illustrating a computing system, according to an embodiment of the present disclosure.

FIG. 26 is a diagram illustrating a computing system 4000 according to an embodiment of the present disclosure.

Referring to FIG. 26, the computing system 4000 may include a memory device 1110, a memory controller 1200, a microprocessor 4100, a user interface 4200, and a modem 4400, which are electrically coupled to a bus. When the computing system 4000 is a mobile device, a battery 4300 for supplying operation voltages of the computing system 4000 may be additionally provided in the computing system 4000. Although not shown in this figure, the computing system 4000 may further include an application chip set, a camera image processor, a mobile DRAM, and the like. The memory controller 1200 and the memory device 1110 may constitute a solid state drive/disk (SSD).

The computing system 4000 may be packaged in various forms. For example, the computing system 4000 may be packaged in a manner such as package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small out line package (SSOP), thin small outline package (TSOP), thin quad flat pack (TQFP), system in package (SIP), multi chip package (MCP), wafer-level fabricated package (WFP), or wafer-level processed stack package (WSP).

According to the present disclosure, when any erased sub-block exists among sub-blocks included in a memory block, voltages required to perform: a read operation are adjusted so as to compensate for a change in resistance in a string, thereby improving the reliability of read operation.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A storage device comprising:
   a memory block including a plurality of sub-blocks having normal cells storing normal data and spare cells storing information on erased sub-blocks;
   a peripheral circuit suitable for generating operation voltages used in a read operation on a selected sub-block, and performing the read operation on the selected sub-block using the operation voltages; and
   a control logic suitable for, in the read operation, controlling the peripheral circuit to lower a level of at least one operation voltage when an erased sub-block is included in the memory block.

2. The storage device of claim 1, wherein, in the read operation, the peripheral circuit generates:
   a first read voltage applied to a selected word line coupled to the memory block or a second read voltage lower than the first read voltage;
   a first pass voltage applied to unselected word lines coupled to the memory block or a second pass voltage lower than the first pass voltage; and
   a first turn-on voltage applied to select lines coupled to the memory block or a second turn-on voltage lower than the first turn-on voltage.

3. The storage device of claim 2, wherein the memory block includes U-shaped strings including a pipe transistor, and
   wherein the peripheral circuit, in the read operation, generates a first pipe voltage applied to a pipe line coupled to a gate of the pipe transistor or a second pipe voltage lower than the first pipe voltage.

4. The storage device of claim 2, wherein, when the erased sub-block is not included in the memory block, the peripheral circuit generates the first read voltage, the first pass voltage, and the first turn-on voltage, and
   wherein, when the erased sub-block is included in the memory block, the peripheral circuit generates at least one of the second read voltage, the second pass voltage, and the second turn-on voltage.

5. The storage device of claim 1, wherein the control logic includes a register storing information on erased sub-blocks.

6. The storage device of claim 5, wherein the register stores various read parameters set according to a number of the erased sub-blocks.

7. A method of operating a storage device, the method comprising:
   determining whether an erased sub-block exists in a selected memory block; and
   performing, when it is determined that the erased sub-block exists, a read operation on the selected memory block using second operation voltages having lower levels than first operation voltages which are applied to the selected memory block when it is determined that the erased sub-block does not exist,
   wherein the first operation voltages include a first read voltage applied to a selected word line, a first pass voltage applied to unselected word lines, a first source turn-on voltage applied to a source select line, and a first drain turn-on voltage applied to a drain select line, and
   wherein the second operation voltages include at least one of a second source turn-on voltage lower than the first source turn-on voltage, and a second drain turn-on voltage lower than the first drain turn-on voltage.

8. The method of claim 7, wherein the read operation is performed on a programmed sub-block included in the selected memory block.

9. The method of claim 7, wherein the second operation voltages include at least one of a second read voltage lower than the first read voltage, and a second pass voltage lower than the first pass voltage.

10. The method of claim 7, wherein the selected memory block includes U-shaped strings including a pipe transistor, and
    wherein a first pipe voltage coupled to a gate of the pipe transistor or a second pipe voltage lower than the first pipe voltage is applied when the read operation is performed.

11. The method of claim 7, wherein, when dummy cells are included in the selected memory block, the first pass voltage or the second pass voltage is applied to dummy lines coupled to gates of the dummy cells when the read operation is performed.

12. A storage device comprising:
    a memory block including a plurality of sub-blocks;
    a peripheral circuit suitable for generating operation voltages used in a read operation on a selected sub-block, and performing the read operation on the selected sub-block using the operation voltages; and
    a control logic suitable for, in the read operation, controlling the peripheral circuit in response to a command and an address to lower a level of at least one operation voltage when an erased sub-block is included in the memory block, wherein the control logic includes a register storing information of the erased sub-block.

13. The storage device of claim 12, wherein, in the read operation, the peripheral circuit generates:
    a first read voltage applied to a selected word line coupled to the memory block or a second read voltage lower than the first read voltage;
    a first pass voltage applied to unselected word lines coupled to the memory block or a second pass voltage lower than the first pass voltage; and
    a first turn-on voltage applied to select lines coupled to the memory block or a second turn-on voltage lower than the first turn-on voltage.

14. The storage device of claim 12, wherein, when the erased sub-block is not included in the memory block, the peripheral circuit generates the first read voltage, the first pass voltage, and the first turn-on voltage, and wherein, when the erased sub-block is included in the memory block, the peripheral circuit generates at least one of the second read voltage, the second pass voltage, and the second turn-on voltage.

* * * * *